(12) United States Patent
Shibata et al.

(10) Patent No.: US 8,379,444 B2
(45) Date of Patent: Feb. 19, 2013

(54) SEMICONDUCTOR MEMORY DEVICE CAPABLE OF ACCURATE READING EVEN WHEN ERASURE LEVEL CHANGES

(75) Inventors: Noboru Shibata, Kawasaki (JP); Kazunori Kanebako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/883,472

(22) Filed: Sep. 16, 2010

(65) Prior Publication Data

US 2011/0170347 A1    Jul. 14, 2011

(30) Foreign Application Priority Data

Jan. 13, 2010    (JP) .................................. 2010-005261

(51) Int. Cl.
    *G11C 11/34*    (2006.01)
(52) U.S. Cl. ................................................. 365/185.03
(58) Field of Classification Search ............. 365/185.17, 365/185.33, 189.05
    See application file for complete search history.

(56) References Cited

U.S. PATENT DOCUMENTS

| | | | |
|---|---|---|---|
| 5,867,429 A * | 2/1999 | Chen et al. ............... | 365/185.33 |
| 6,317,361 B2 * | 11/2001 | Yoshida et al. .......... | 365/185.09 |
| 6,879,520 B2 * | 4/2005 | Hosono et al. ........... | 365/185.17 |

FOREIGN PATENT DOCUMENTS

| JP | 2004-326866 | 11/2004 |
|---|---|---|
| KR | 10-2009-0005549 | 1/2009 |

OTHER PUBLICATIONS

Office Action issued Oct. 27, 2011 in Korea Application No. 10-2010-85837 (With English Translation).

* cited by examiner

*Primary Examiner* — Hoai V Ho
*Assistant Examiner* — Pablo Huerta
(74) *Attorney, Agent, or Firm* — Oblon, Spivak, McClelland, Maier & Neustadt, L.L.P.

(57) ABSTRACT

According to one embodiment, a semiconductor memory device includes a memory cell array and a controller. The memory cell array includes first, second, and third memory cells each of which stores k-bit data (where k is a natural number not smaller than 1). The first and second memory cells are adjacent to each other, and the second and third memory cells are adjacent to each other. Data is stored into the memory cells in an order of the first, second, and third memory cells. When reading data from the second memory cells, the controller reads data from the first and third memory cells, and changes read conditions for the second memory cell in accordance with the read data.

14 Claims, 21 Drawing Sheets

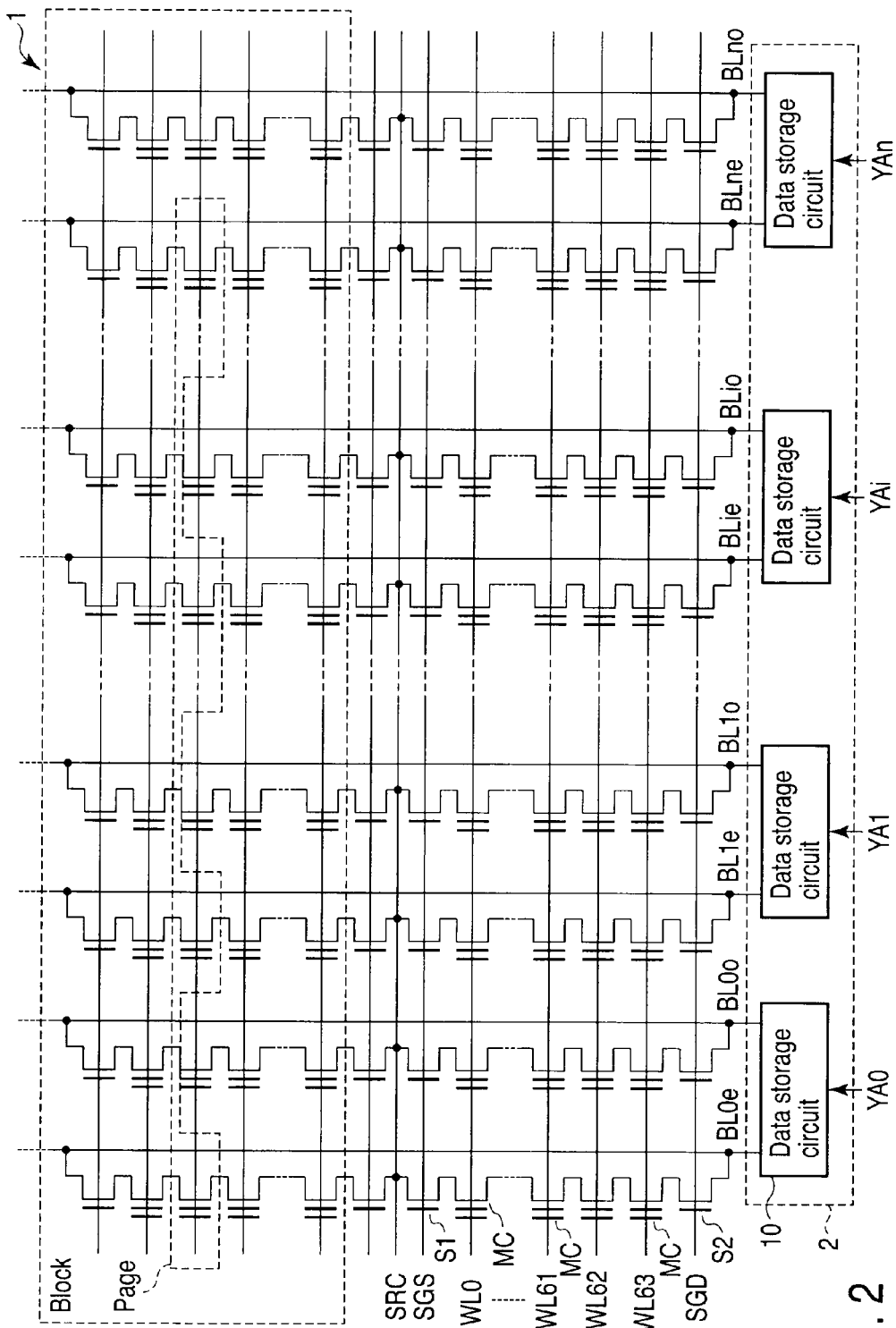
F I G. 2

| | Cell (P-Well) | Cell (N-Well) | H.V.Tr (P-sub) | L.V.Nch(P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V) / Vpgmh |
| Read | Vss (0V) | Vss (0V) | Vss (0V) | Vss (0V) | Vdd (2.5V) | Vdd (2.5V) / Vreadh |

F I G. 6

|       | AR | BR | CR | DR |
|-------|----|----|----|----|
| WLn+1 | 1  | 1  | 0  | 0  |
| WLn-1 | 1  | 0  | 1  | 0  |

FIG. 17

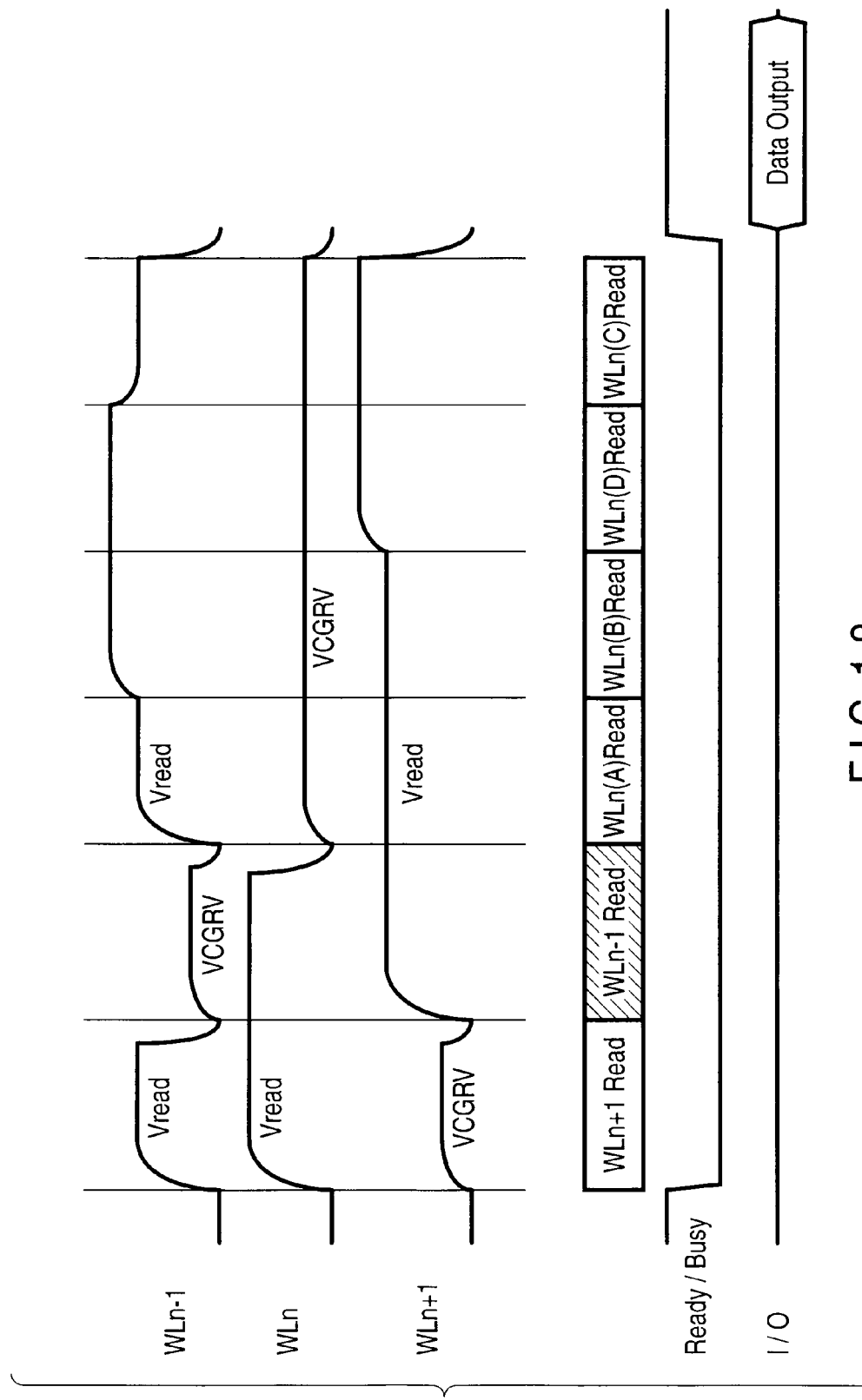
F I G. 1 8

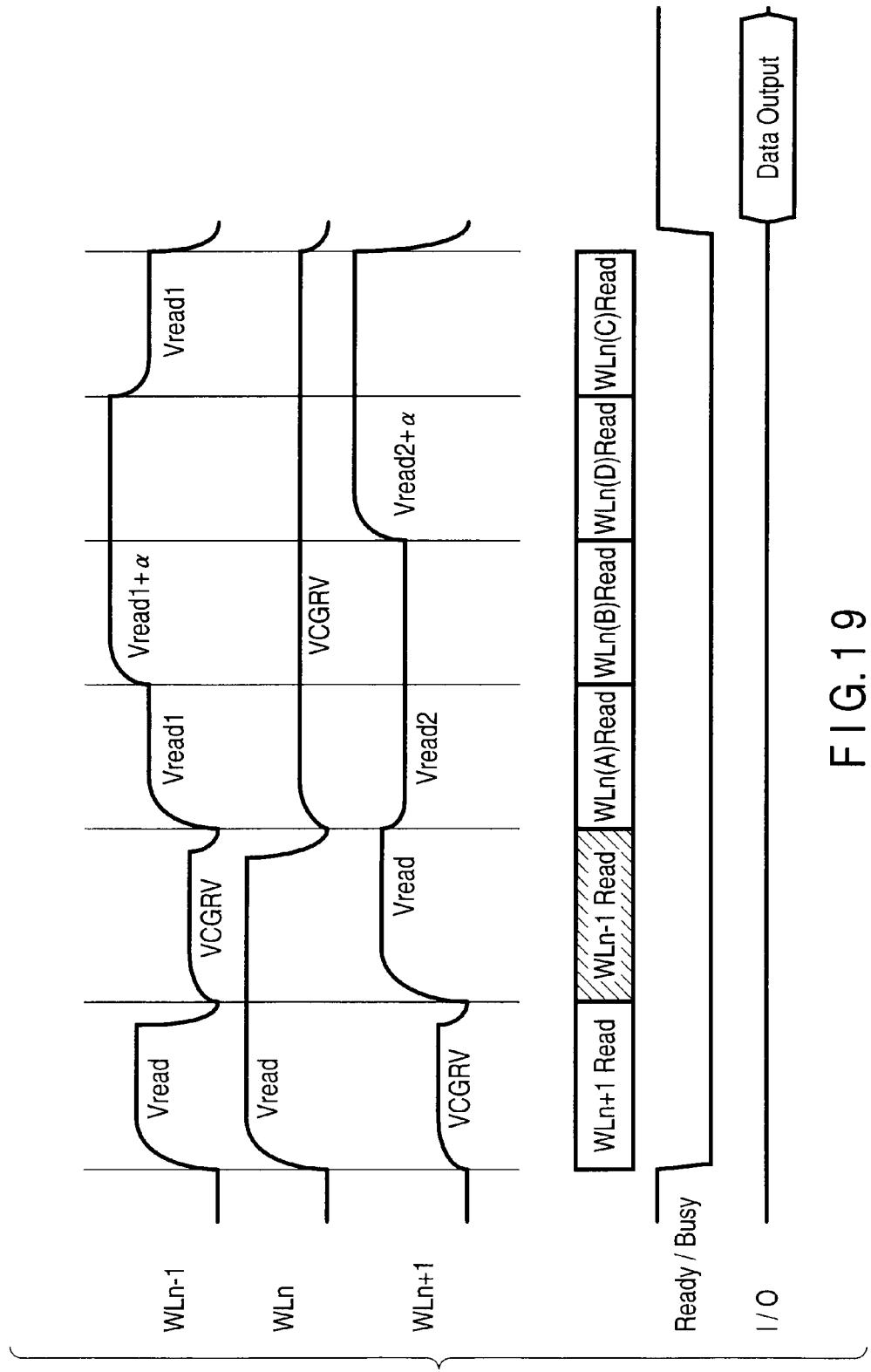
F I G. 19

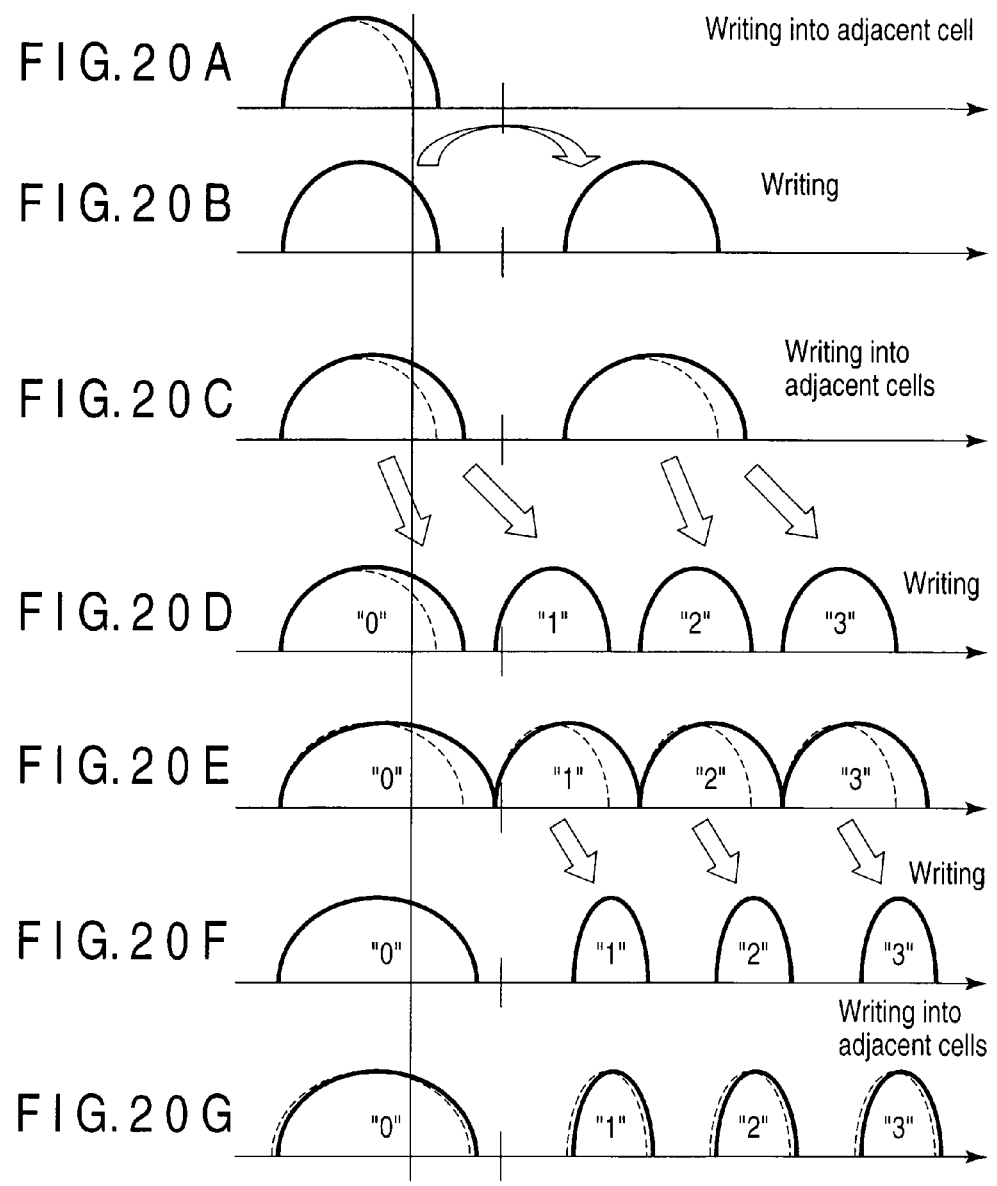

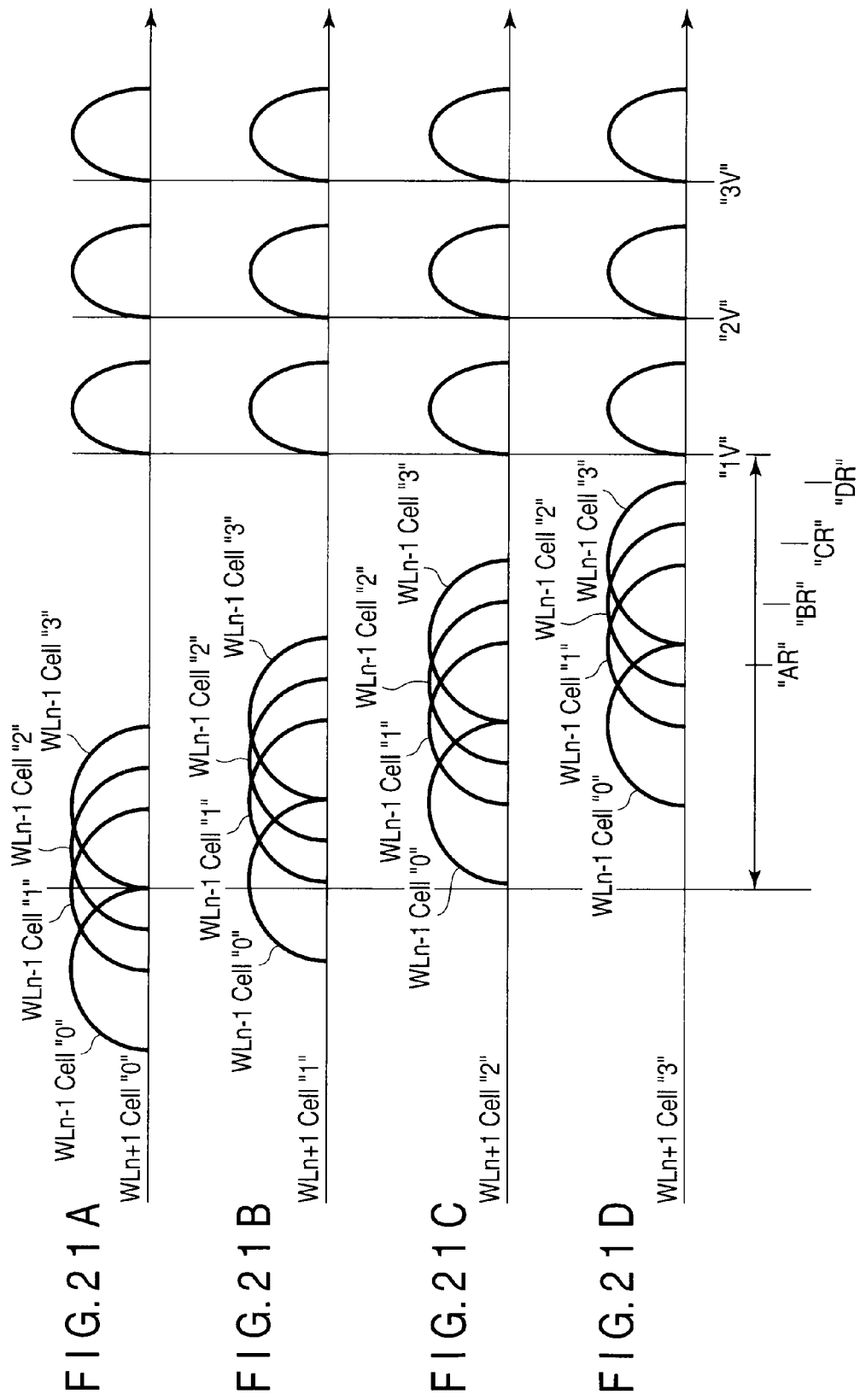

|       |     | WLn+1 Cell |      |      |      |
|-------|-----|------|------|------|------|
|       |     | "0"  | "1"  | "2"  | "3"  |
| WLn-1 Cell | "0" | 0    | 0.15 | 0.25 | 0.35 |
|       | "1" | 0.15 | 0.3  | 0.4  | 0.5  |
|       | "2" | 0.25 | 0.4  | 0.5  | 0.6  |
|       | "3" | 0.35 | 0.5  | 0.6  | 0.7  |

Read level "AR" 0 only

Read level "BR" 0.15~0.3

Read level "CR" 0.35~0.5

Read level "DR" 0.6 or more

F I G. 2 2

US 8,379,444 B2

SEMICONDUCTOR MEMORY DEVICE CAPABLE OF ACCURATE READING EVEN WHEN ERASURE LEVEL CHANGES

CROSS-REFERENCE TO RELATED APPLICATIONS

This application is based upon and claims the benefit of priority from Japanese Patent Application No. 2010-005261, filed Jan. 13, 2010; the entire contents of which are incorporated herein by reference.

FIELD

Embodiments described herein relate generally to a semiconductor memory device, such as a NAND flash memory, which is capable of storing 2-level data and multi-level data.

BACKGROUND

In a NAND flash memory, all or half of plural cells arranged in a row direction each are connected to write and read latch circuits through a bit line. A write or read operation is performed on all or half of the plural cells arranged in the row direction (for example, cells equivalent to 2 to 8 kB) at one time.

Units of writing and reading are referred to as pages, and one block is constituted by plural pages. Erasure of memory cells is performed in units of blocks. In an erase operation, electrons are pulled out of memory cells, thereby making threshold voltages negative. In a write operation, electrons are injected into memory cells, thereby setting threshold voltages to be positive.

Recently, a multi-level memory has been developed in which one of plural threshold voltages (hereinafter also referred to as threshold levels) is set to enable storage of data constituted by multiple bits. For example, when four threshold levels are given, 2-bit data can be stored in one cell. When eight threshold levels are given, 3-bit data can be stored in one cell. Further, when sixteen threshold levels are given, 4-bit data can be stored in one cell.

Meanwhile, there is a tendency that capacitive coupling between adjacent cells increases as elements are more micronized. Therefore, there is a problem that a threshold level of a cell which is written first changes when an adjacent cell is written. Therefore, there has been proposed that, when data is read from a word line WLn, data from a word line WLn+1 which is written after a word line WLn is read, and a read voltage for the word line WLn is corrected depending on a level of the data (for example, see Jpn. Pat. Appln. KOKAI Publication No. 2004-326866).

However, an erasure level of cells connected to the word line WLn varies depending on a level of the word line WLn−1 written before the word line WLn. Therefore, there is a problem that a read margin for cells connected to the word line WLn decreases. Therefore, there is a demand for a semiconductor memory device which can suppress any influence of capacitive coupling with adjacent cells and accurately read even when an erasure level changes.

BRIEF DESCRIPTION OF THE DRAWINGS

FIG. 2 is a circuit diagram representing an example of a configuration of a memory cell array 1 and a bit line control circuit 2 represented in FIG. 1;

FIG. 6 is a table representing voltages of respective parts in erasing, programming, and reading a semiconductor memory device;

FIG. 17 is a table representing a relationship between read levels and read data, according to the first embodiment;

FIG. 18 is a waveform chart representing a read operation according to the second embodiment;

FIG. 19 is a waveform chart representing a modification to FIG. 18;

FIGS. 20A, 20B, 20C, 20D, 20E, 20F and 20G represent a write operation for 4-level data;

FIGS. 21A, 21B, 21C, and 21D are a graph representing changes of threshold voltages of erased cells in accordance with writing into adjacent cells;

FIG. 22 is a graph representing read levels, according to the third embodiment;

DETAILED DESCRIPTION

In general, according to one embodiment, a semiconductor memory device includes a memory cell array and a controller. The memory cell array includes first, second, and third memory cells each of which stores k-bit data (where k is a natural number not smaller than 1). The first and second memory cells are adjacent to each other, and the second and third memory cells are adjacent to each other. Data is stored into the memory cells in an order of the first, second, and third memory cells. When reading data from the second memory cell, the controller reads data from the first and third memory cells, and changes read conditions for the second memory cell in accordance with the read data.

Hereinafter, embodiments will be described with reference to the drawings.

First Embodiment

Figure 1:
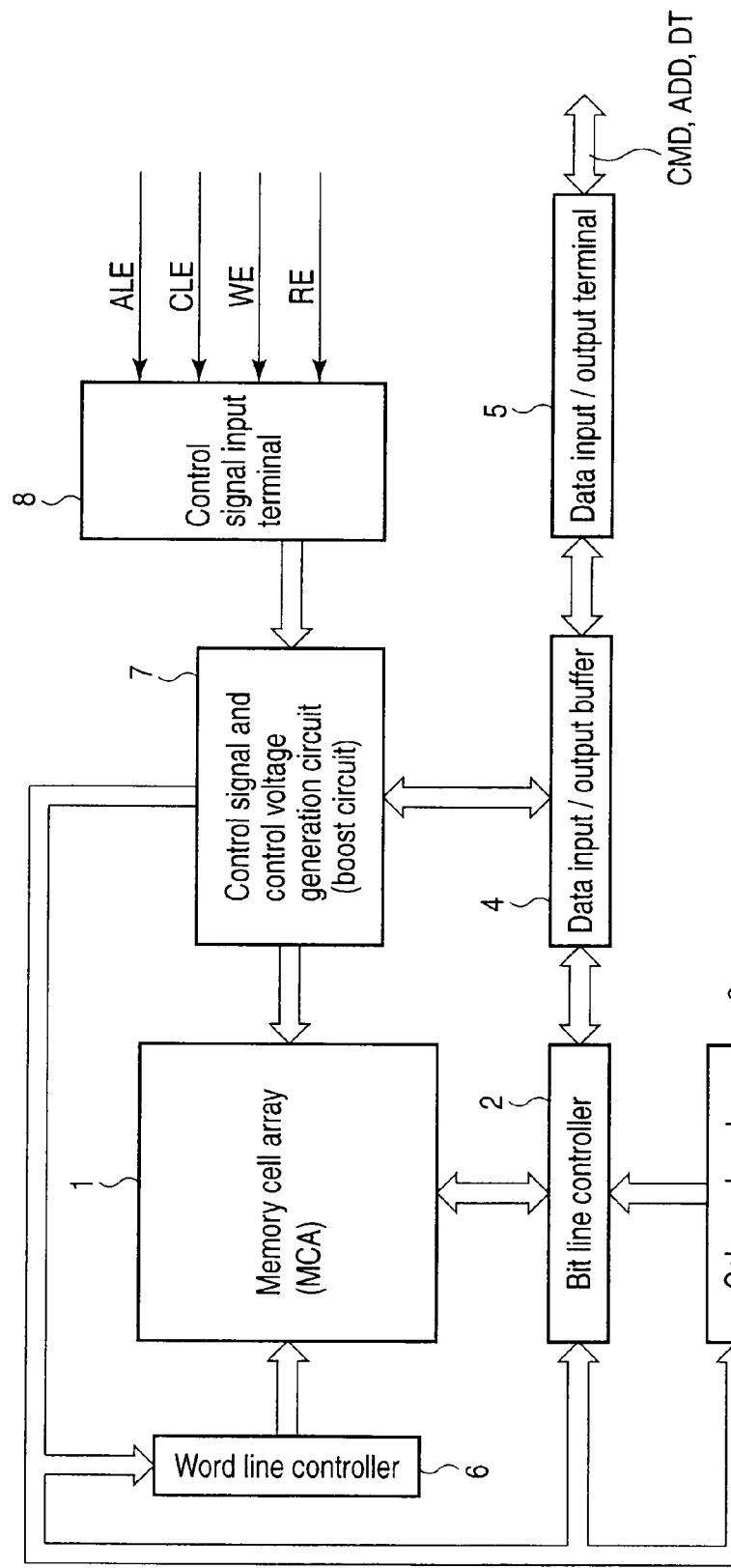
FIG. 1 is a configuration diagram representing a NAND flash memory as a semiconductor memory device applied to the embodiments.

FIG. 1 represents a configuration of a NAND flash memory, as a semiconductor memory device which stores, for example, 4 levels (2 bit) into each memory cell. However, the embodiment is not limited to 2-bit data but can store higher-bit data than 2-bit data.

The memory cell array 1 includes plural bit lines, plural word lines, and common source lines. In the memory cell array 1, memory cells constituted by, for example, EEPROM cells and capable of electrically rewriting data are arrayed in a matrix. The memory cell array 1 is connected to a bit line control circuit 2 for controlling the bit lines, and to a word line control circuit 6.

The bit line control circuit 2 reads data from memory cells in the memory cell array 1 through the bit lines, detects states of the memory cells in the memory cell array 1 through the bit lines, and applies a write control voltage to the memory cells in the memory cell array 1 through the bit lines, to execute writing. The bit line control circuit 2 is connected to a column decoder 3 and a data input/output buffer 4. A data storage circuit in the bit line control circuit 2 is selected by a column decoder 3. Data in the memory cells, which has been read into the data storage circuit, is externally output from the data input/output terminal 5 through the data input/output buffer 4. The data input/output terminal 5 is connected to an unillustrated host outside the memory chip. This host is constituted by, for example, a microcomputer, and receives data output from the data input/output terminal 5. Further, a host outputs various commands CMD for controlling operations of the NAND flash memory, addresses ADD, and data DT. Write data input from the host to the data input/output terminal 5 is supplied through the data input/output buffer 4 to a data storage circuit selected by the column decoder 3. Commands and addresses are supplied to a control-signal/control-voltage generation circuit 7.

The word line control circuit 6 is connected to the memory cell array 1. The word line control circuit 6 selects word lines in the memory cell array 1, and applies the word lines with a voltage required for reading, writing, or erasing.

The memory cell array 1, bit line control circuit 2, column decoder 3, data input/output buffer 4, and word line control circuit 6 are connected to and controlled by the control-signal/control-voltage generation circuit 7. The control-signal/control-voltage generation circuit 7 is connected to a control signal input/output terminal 8, and is controlled by control signals ALE (Address Latch Enable), CLE (Command Latch Enable) input from the host through the control signal input/output terminal 8, WE (Write Enable), and RE (Read Enable). The control-signal/control-voltage generation circuit 7 generates voltages for word lines and bit lines when writing data, and a voltage supplied to wells when erasing data. The control-signal/control-voltage generation circuit 7 includes, for example, a boost circuit such as a charge pump circuit, and can generate a program voltage, a read voltage, an erasure voltage, and other voltages.

For example, the bit line control circuit 2, word line control circuit 6, and control-signal/control-voltage generation circuit 7 constitute a controller which controls write and read operations.

FIG. 2 represents an example of a configuration of the memory cell array 1 represented in FIG. 1, and the bit line control circuit 2. Plural NAND units are provided in the memory cell array 1. Each NAND unit is constituted by 64 memory cells MC connected in series, and select gates S1 and S2. Each of memory cells is composed of an EEPROM. The select gate S2 is connected to bit lines BL0e, and the select gate S1 is connected to a source line SRC. Control gates of memory cells MC arranged in each row are connected in common to a corresponding one of word lines WL0 to WL63. The select gates S2 are connected in common to a select line SGD, and the select gates S1 are connected to a select line SGS.

The bit line control circuit 2 includes plural data storage circuits 10. The data storage circuits 10 are respectively connected to pairs of bit lines (BL0e, BL0o), (BL1e, BL1o), . . . (BLie, BLio), (BLne, BLno).

The memory cell array 1 includes plural blocks as denoted by broken lines. Each of the blocks is constituted by plural NAND units. For example, data is erased in units of blocks. Further, an erase operation is performed simultaneously on two bit lines connected to each of the data storage circuits 10.

Further, one sector is constituted by plural memory cells which are arranged on every other bit line and are connected to one word line (i.e., memory cells surrounded by a broken line). For each sector, data is written and read. That is, half of plural memory cells which are arranged in a row direction are connected to a corresponding bit line. Therefore, the write operation and the read operation each are performed on half of the plural memory cells arranged in one row direction.

In the read operation, program verify operation, and program operation, one of two bit lines (BLie, BLio) connected to each of a data storage circuit 10 is selected in accordance with an address signal (YA0, YA1, YA1, . . . , YAn). Further, in accordance with the external address, one word line is selected, and two pages denoted by a broken line are selected. Switching between the two pages is performed by an address.

When two bits are stored in one cell, two pages are selected. When one bit is stored in one cell, one page is selected. When three bits are stored in one cell, three pages are selected. When four bits are stored in one cell, four pages are selected.

Figure 3:
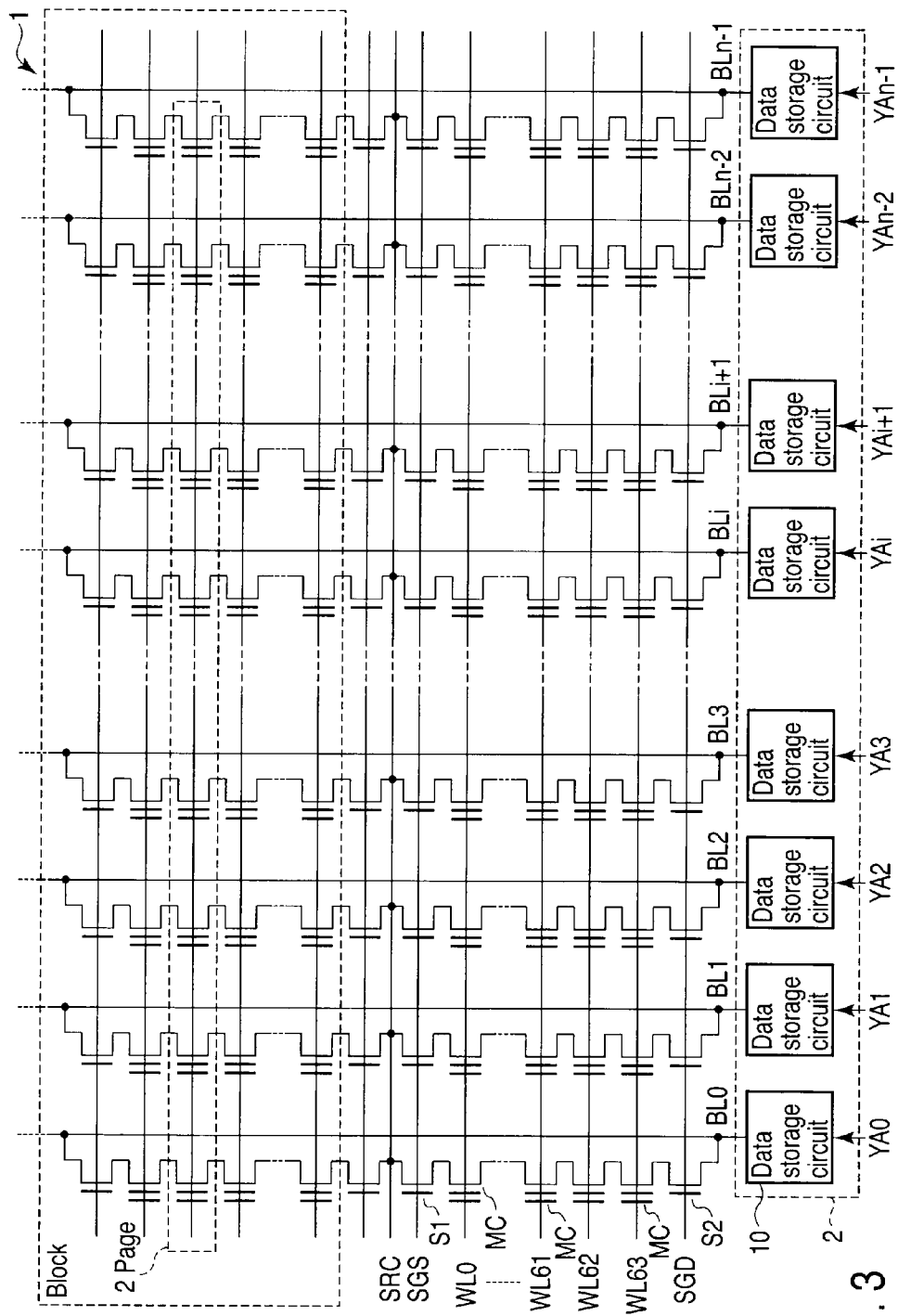
FIG. 3 is a circuit diagram representing another example of a configuration of a memory cell array 1 and a bit line control circuit 2 represented in FIG. 1.

FIG. 3 represents another example of the configuration of the memory cell array 1 and bit line control circuit 2 represented in FIG. 1. In the configuration of FIG. 2, two bit lines (BLie, BLio) are connected to each of the data storage circuits 10. In contrast, in the configuration of FIG. 3, each of the bit lines is connected to a data storage circuit 10, and plural memory cells arranged in a row direction are all respectively connected to corresponding bit lines. Therefore, a write or read operation can be performed on all memory cells arranged in a row direction.

Descriptions made below are applicable to both of the configurations represented in FIG. 2 and FIG. 3. However, a case of applying FIG. 3 will now be described below.

Figures 4A, 4B:
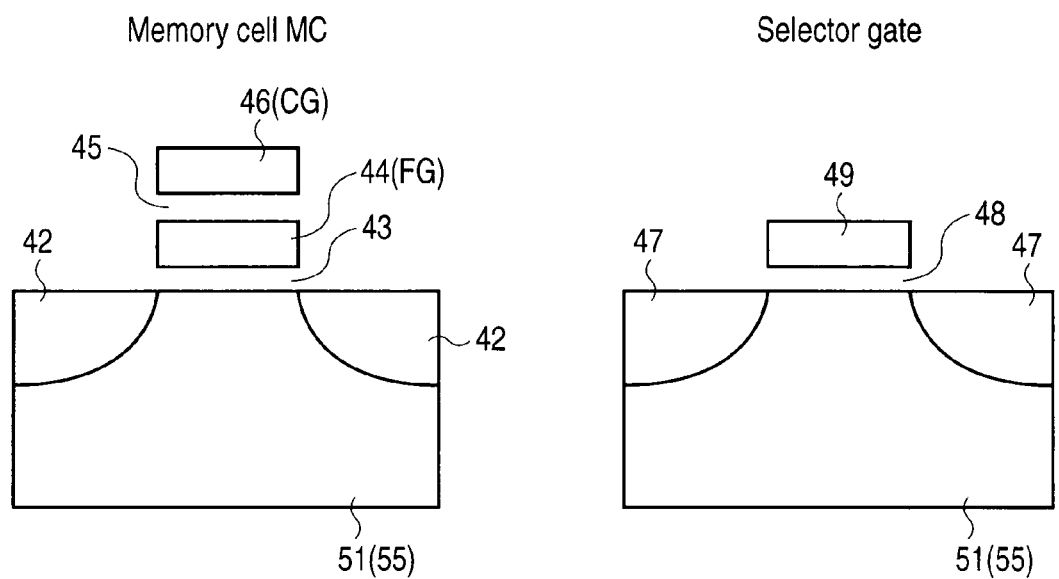
FIG. 4A shows cross-sectional views of a memory cell.
FIG. 4B shows cross-sectional views of a select gate.

FIG. 4A and FIG. 4B are cross-sectional views of a memory cell and a selector transistor. FIG. 4A illustrates a memory cell. An n-type diffusion layer 42 is formed as a source and a drain of the memory cell in a substrate 51 (a P-type well region 55 described later). A gate insulating film 43 is formed on the P-type well region 55, and a floating gate (FG) 44 is formed on the gate insulating film 43. An insulating film 45 is formed on the floating gate 44, and a control gate (CG) 46 is formed on the insulating film 45. FIG. 4B represents a select gate. An n-type diffusion layer 47 is formed as a source and a drain in the P-type well region 55. A gate insulating film 48 is formed on the P-type well region 55, and a control gate 49 is formed on the gate insulating film 48.

Figure 5:
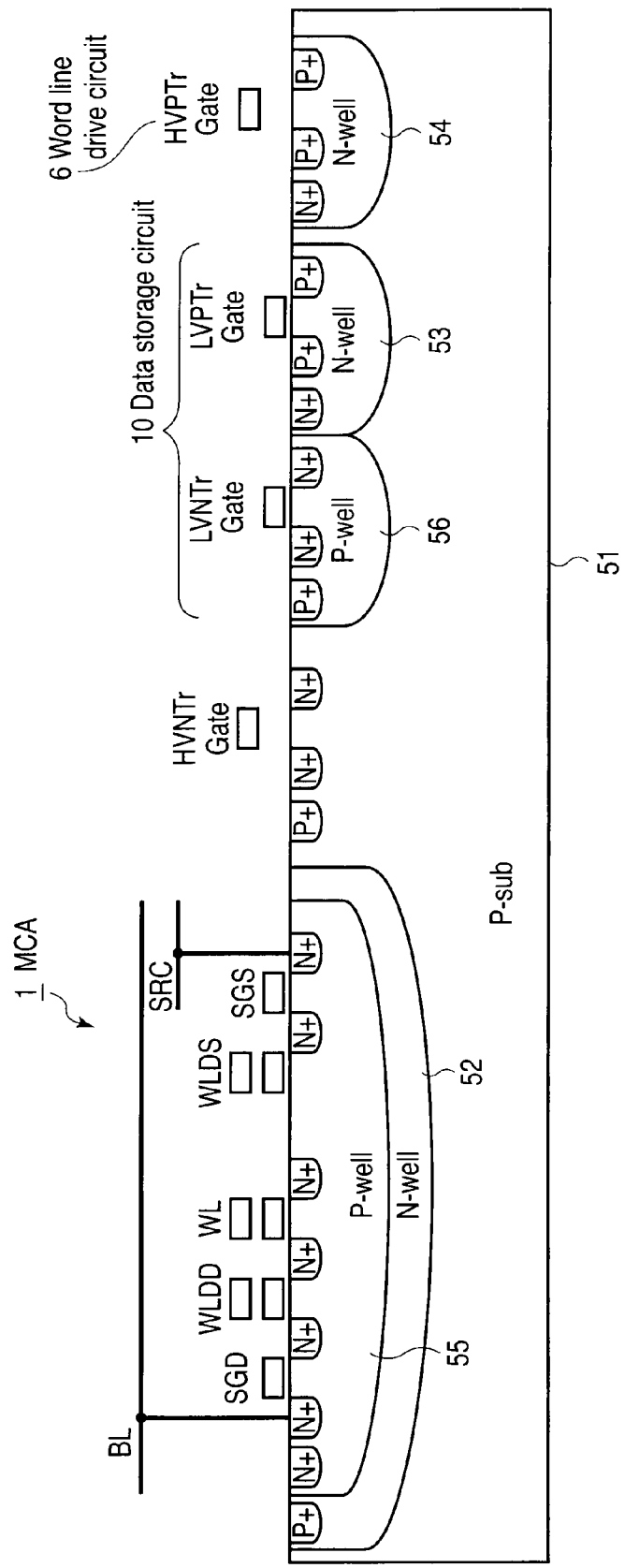
FIG. 5 is a cross-sectional view representing a configuration of a semiconductor memory device.

FIG. 5 shows cross-sectional views of the NAND flash memory. For example, n-type well regions 52, 53, and 54 and an N-type well region 56 are formed in a P-type semiconductor substrate 51. A P-type well region 55 is formed in the N-type well region 52. Low-voltage N-channel transistors LVNTr forming the memory cell array 1 are formed in the P-type well region 55. Further, low-voltage P-channel transistors LVPTr and low-voltage N-channel transistors LVNTr forming the data storage circuits 10 are formed in the N-type well region 53 and P-type well region 56. High-voltage N-channel transistors HVNTr which connect bit lines and the data storage circuit 10 are formed in the substrate 51. Also, in the N-type well region 54, high-voltage P-channel transistors HVPTr which form, for example, a word line drive circuit are formed. As represented in FIG. 5, high-voltage transistors HVNTr and HVPTr are provided with, for example, a thicker gate insulating film than low-voltage transistors LVNTr and LVPTr.

FIG. 6 represents an example of voltages supplied to areas represented in FIG. 5. In an erase operation, a program operation, and a read operation, voltages as represented in FIG. 6 are supplied. Here, Vera is a voltage applied to the substrate when erasing data, Vss is a ground voltage, and Vdd is a power supply voltage. VX is a voltage boosted higher than Vdd, and Vdd is a reduced voltage. Vpgmh is a voltage applied to gates of N-channel MOS transistors in the row decoder when writing data, and is a potential which allows a write voltage Vpgm for word lines to pass without causing a reduction equivalent to a threshold voltage of the N-channel MOS transistors. That is, Vpgmh is a voltage Vpgm supplied to the word lines+Vth (Vth: threshold voltage for N-channel MOS transistors). Vreadh is a voltage applied to gates of the N-channel MOS transistors in the row decoder at the time of reading, and is a potential which allows Vread to pass without reducing a threshold voltage of the N-channel MOS transistors. That is, Vread is a voltage supplied to the word lines, and is Vread+Vth (Vth: threshold voltages of N-channel MOS transistors) at the time of reading.

Furthermore, Vpass is a voltage to be supplied to word lines of non-selected cells when writing data, and Vread is a voltage supplied to non-selected cells when reading data.

Figure 7:
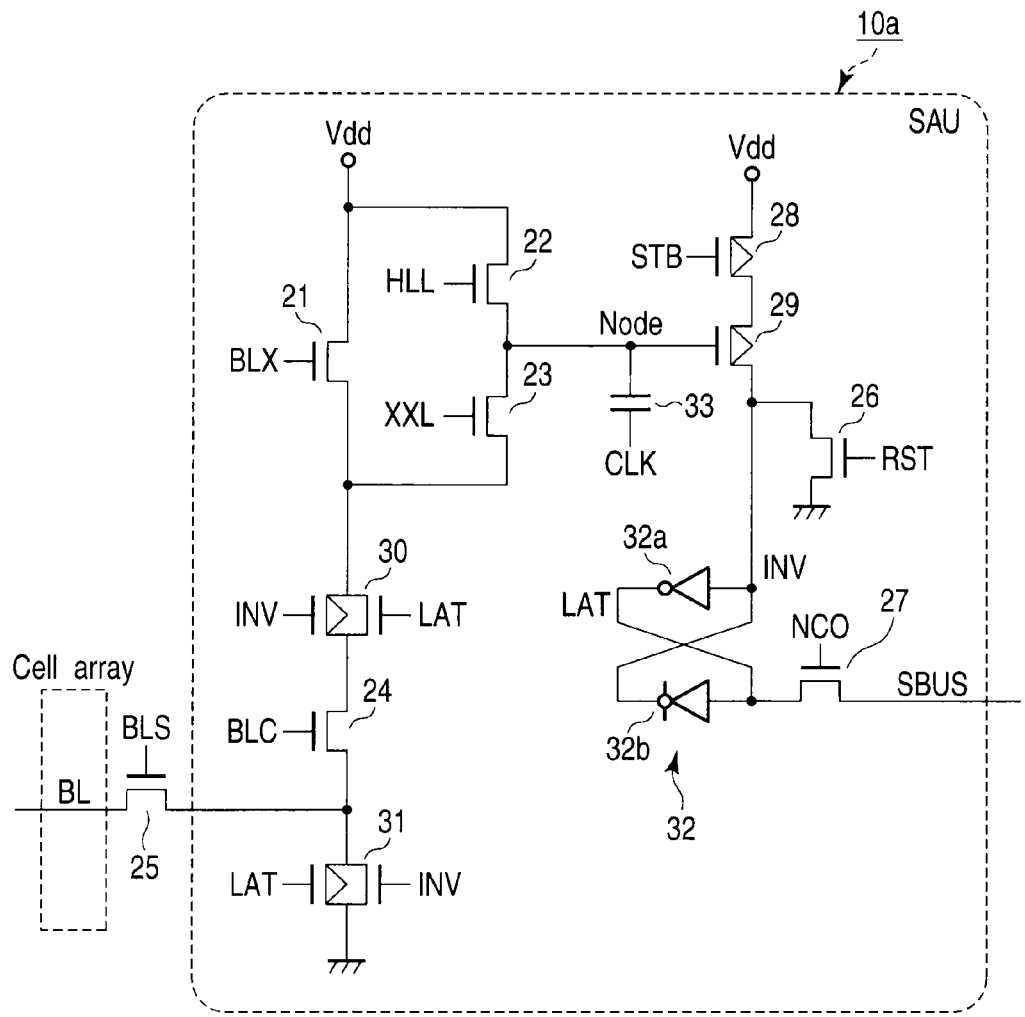
FIG. 7 represents a part of a data storage circuit represented in FIG. 2 and FIG. 3, and also representing a sense amplifier unit.
Figure 8:
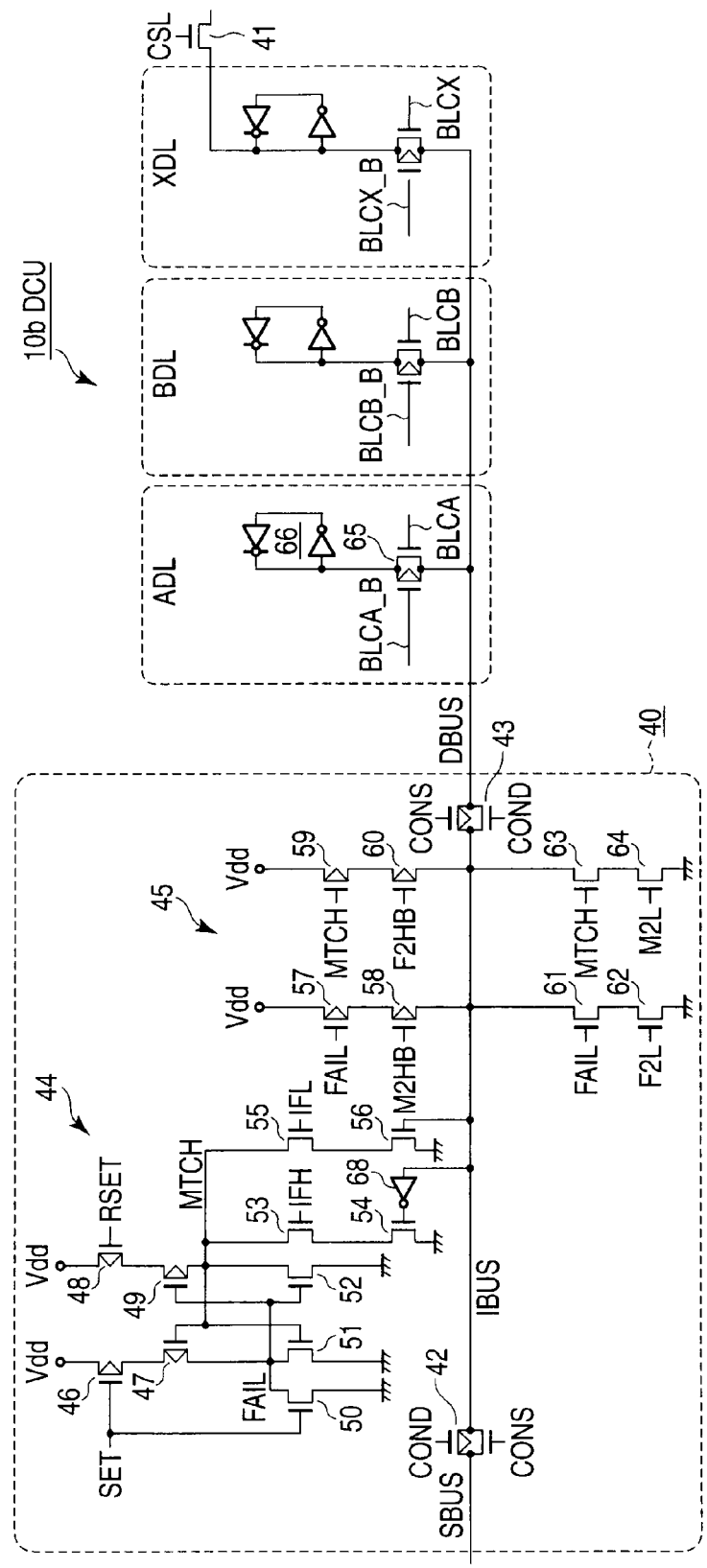
FIG. 8 is a circuit diagram representing a part of the data storage circuit represented in FIG. 2 and FIG. 3, and representing a data control unit.

FIG. 7 and FIG. 8 represent an example of the data storage circuit 10 represented in FIG. 2 and FIG. 3. The data storage circuit 10 is constituted by a sense amplifier unit (SAU) 10a represented in FIG. 7, and a data control unit (DCU) 10b in FIG. 8.

In FIG. 7, the sense amplifier unit 10a is constituted by plural N-channel MOS transistors (hereinafter referred to as NMOS) 21 to 27, plural P-channel MOS transistors (hereinafter referred to as PMOS) 28 and 29, transfer gates 30 and 31, a latch circuit 32, and a capacitor 33. The latch circuit 32 is constituted by, for example, clocked inverter circuits 32a and 32b.

An end of a current path of the NMOS 21 is connected to a node supplied with a power supply voltage Vdd, and another end of the current path is grounded through a transfer gate 30, an NMOS 24, and a transfer gate 31. A connection node between the NMOS 24 and transfer gate 31 is connected to an end of the current path of the NMOS 25. Another end of the NMOS 25 is connected to a bit line BL provided on the memory cell array. A serial circuit of NMOS 22 and NMOS 23 is connected in parallel with the NMOS 21.

Further, an end of the current path of a PMOS 28 is connected to a node supplied with a power supply voltage Vdd, and another end is connected to an input end of an inverter circuit 32a which constitutes a latch circuit 32 through the PMOS 29, and is grounded through NMOS 26. An input end of a clocked inverter circuit 32b which is cross-connected the inverter circuit 32a is connected to data control unit (DCU) 10b through an NMOS 27. Further, the gate of the PMOS 29 is connected to a connection node between NMOS 22 and NMOS 23. An end of a capacitor 33 is connected to the connection node. Another end of the capacitor 33 is supplied with a clock signal CLK.

The gate of the NMOS 21 is supplied with a signal BLX. A gate of an NMOS constituting a transfer gate 30 is supplied with a signal LAT at an output end of an inverter circuit 32a which constitutes a latch circuit 32. A gate of the PMOS transistor is supplied with a signal INV at an input end of the inverter circuit 32a. A gate of the NMOS 24 is supplied with a signal BLC, and a gate of the NMOS 25 is supplied with a signal BLS. A gate of an NMOS constituting a transfer gate 31 is supplied with a signal INV at an input end of an inverter circuit 32a which constitutes the latch circuit 32. A gate of the PMOS transistor is supplied with a signal LAT at an output end of the inverter circuit 32a.

The gate of the NMOS 22 is supplied with a signal HLL, and the gate of the NMOS 23 is supplied with a signal XXL.

The gate of a PMOS 28 is supplied with a signal STB, and the gate of the NMOS 26 is supplied with a reset signal RST. The gate of the NMOS 27 is supplied with a signal NCO.

Operation of the sense amplifier unit will now be schematically described.

(Write Operation)

When data is written into memory cells, at first, a signal STB is set to a high level (hereinafter referred to as level H), and a reset signal RST is temporarily set to the level H, thereby to reset the latch circuit 32. The LAT is set to the level H, and the signal INV is set to a low level (hereinafter referred to as level L).

Thereafter, the signal NCO is set to the level H, and data is taken in from the data control unit 10b. When this data is at the level L ("0") which indicates "write", the signal LAT goes to the level L, and the signal INV goes to the level H. Otherwise, when the data is at the level H ("1") which indicates "non-write", the data in the latch circuit 32 is not changed but the signal LAT and the signal INV are respectively maintained at the levels H and L.

Subsequently, when the signal LAT is at the level L and the signal INV is at the level H (write) where signals BLX, BLC, and BLS are at the level H, the transfer gate 30 is turned off and the transfer gate 31 is turned on to set the bit line BL to Vss. When the word line reaches the voltage Vpgm in this state, data is written into the memory.

On the other side, in the latch circuit 32, when the signal LAT is at the level H and the signal INV is at the level L (non-write), the transfer gate 30 is on and the transfer gate 31 is off. Therefore, the bit line BL is charged to Vdd. Accordingly, when the word line reaches Vpgm, a channel of the cell is boosted up to a high potential, and data is therefore not written into the memory cell.

(Read Operation, Program Verify Read Operation)

When data is read from memory cells, at first, the reset signal RST is once set to the level H, thereby resetting the latch circuit 32, and the signals LAT and INV are set to the levels H and L. Thereafter, signals BLS, BLC, BLX, HLL, and XXL are set to predetermined voltages, and the bit line BL is charged. Accordingly, a node of the capacitor 33 is charged to Vdd. When a threshold voltage of a memory cell is higher than a read level (read voltage), the memory cell is in an off-state, and the bit line is maintained at the level H. That is, Node is maintained at the level H. Otherwise, when the threshold voltage of the memory cell is lower than the read level, the memory cell is in an on-state, and electric charges of the bit line BL are discharged. Therefore, the bit line BL goes to the level L. Therefore, Node goes to the level L.

Subsequently, when a signal STB is dropped to the level L, the PMOS 29 is turned on since the Node is at the level L if the memory cell is on. The signal INV of the latch circuit 32 goes to the level H, and the signal LAT goes to the level L. Otherwise, if the memory cell is off, the signal INV of the latch circuit 32 is maintained at the level L, and the signal LAT is maintained at the level H.

Thereafter, when a signal NCO is stepped to the level H, the NMOS 27 is turned on, and data in the latch circuit 32 is transferred to the data control unit 10b.

The program verify operation to verify the threshold voltage of the memory cell after the write operation is the same as that for the read operation.

FIG. 8 represents an example of a data control unit (DCU) 10b.

The data control unit 10b is constituted by a calculation circuit 40 and plural data latch circuits ADL, BDL, XDL, and NMOS 41.

The calculation circuit 40 is constituted by: a bus (hereinafter referred to as IBUS); transfer gates 42 and 43 which are connected to two ends of the IBUS and operate complementarily to each other; a latch circuit 44 which latches data of the IBUS; and a setting circuit 45 which sets levels of data latch circuits ADL, BDL, and XDL.

The transfer gate 42 is operated by complementary signals COND and CONS, and connects the bus of the sense amplifier unit SAU 10a (referred to as SBUS) to the IBUS. The transfer gate 43 is operated by complementary signals CONS and COND, and connects the IBUS to a bus connected to the data latch circuits ADL, BDL, and XDL (hereinafter referred to as DBUS). When the transfer gate 42 is on, the transfer gate 43 is off. When the transfer gate 42 is off, the transfer gate 43 is on.

The latch circuit 44 is constituted by plural PMOS 46 to 49, plural NMOS 50 to 56, and an inverter circuit 68. The gates of the PMOS 46 and NMOS 50 are supplied with a set signal SET, and the gate of the PMOS 48 is supplied with a reset signal REST. The gate of the NMOS 53 is supplied with a signal IFH, and the gate of the NMOS 55 is supplied with a signal IFL. The gate of the NMOS 54 is connected to the IBUS through the inverter circuit 68. The gate of the NMOS 56 is connected to the IBUS.

The setting circuit 45 is constituted by PMOS 57 to 60 and NMOS 61 to 64. Gates of the PMOS 57 and NMOS 61 are supplied with a signal FAIL. The signal FAIL is a signal of a connection node between the PMOS 47 and NMOS 51, as an output end of the latch circuit 44. Gates of the PMOS 59 and NMOS 63 are supplied with a signal MTCH. The signal MTCH is a signal of a connection node between the PMOS 49 and NMOS 52, as an output end of the latch circuit 44. Further, a gate of the PMOS 58 is supplied with a signal M2HB, and a gate of the PMOS 60 is supplied with a signal F2HB. A gate of the NMOS 62 is supplied with a signal F2L, and a gate of the NMOS 64 is supplied with a signal M2L.

The data latch circuits ADL, BDL, and XDL have the same configurations as each other, and each are constituted by a latch circuit 66 and a transfer gate 65 which connects the latch circuit 66 to the DBUS. Each of transfer gates 65 is controlled by signals BLCA, BLCB, and BLCX. The data latch circuit XDL is connected through the NMOS 41 to an external I/O. A gate of the NMOS 41 is supplied with a signal CSL.

The data control unit 10b maintains write data, as described above, and maintains data read from memory cells when reading data.

2-bit write data supplied from the data input/output buffer 6 is latched by the data latch circuits ADL and BDL through the data latch circuit XDL, for example, in a manner that one bit is latched by one of the circuits.

A calculation circuit 40 represented in FIG. 8 can perform calculations, such as AND, OR, and/or exclusive NOR, on data in the data latch circuits ADL and BDL. For example, for AND, data maintained in the data latch circuits ADL and BDL are output to the DBUS and IBUS. In this case, only when data "1" is latched in both the data latch circuits ADL and BDL does IBUS go to the level H. Otherwise, the IBUS is at the level L. That is, only for "non-write", the IBUS goes to "1". For "write", the IBUS is "0". Writing is performed by transferring the data through the SBUS to the sense amplifier unit 10a represented in FIG. 7.

A calculation circuit 40 represented in FIG. 8 may be provided per plural sense amplifier units (SAU) 10 represented in FIG. 7 and per plural data control units (DCU) 10b represented in FIG. 8. In this manner, a circuit area can be reduced.

Operation of the calculation circuit 40 can be variously modified. For example, various control methods are applicable even to one logic calculation, and can be changed upon necessity.

In the present embodiment, there are three data latch circuits; ADL, BDL, and XDL. If a write cache for inputting next data during writing is not required, XDL may be omitted.

For 2-level data, one data latch can be omitted. By omitting a data latch, a chip size can be reduced.

The present NAND flash memory is a multi-level memory. Therefore, 2-bit data can be stored in one cell. Switching to 2-bit is performed by addresses (first and second pages). When storing 2-bit data into one cell, 2 pages are used. However, when storing 3-bit data into one cell, bit numbers are switched by addresses (first page, second page, and third page). When storing 4-bit data into one cell, bit numbers are switched by addresses (first page, second page, third page, and fourth page).

(Write Operation and Read Operation)

Next, an operation of writing or reading data into or from all cells arranged in one row direction at once will be described with reference to 2-level data.

Figure 9:
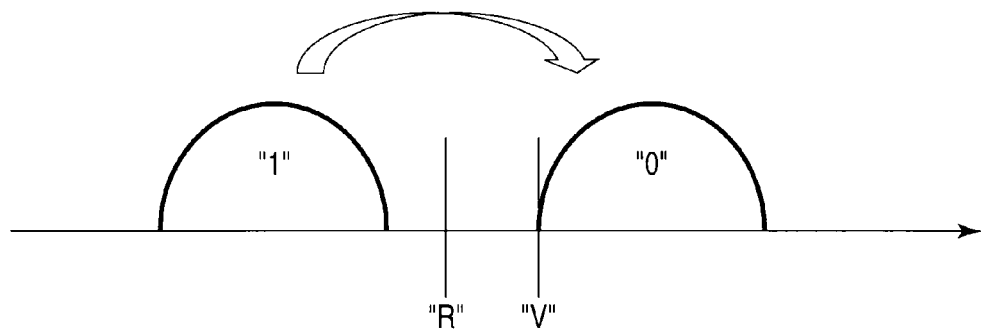
FIG. 9 is a graph representing a threshold voltage and a read level of 2-level data.

FIG. 9 represents a threshold voltage distribution (hereinafter referred to as a threshold voltage) and a read level of 2-level data in memory cells. By an erase operation, data in memory cells come to have a threshold voltage "1". By writing data "0", the threshold voltage is "0".

Reading of 2-level data is performed by using a read level "R" which corresponds to intermediate threshold voltages between data "1" and data "0". A verify level "V" in the write operation is set to be slightly higher than the read level "R" in order to provide a data retention margin.

(Program)

As represented in FIG. 3, FIG. 8, and FIG. 10, at first, data for one page is externally supplied, and is latched by the latch circuit XDL in each of the data storage circuits. Thereafter, 2-level data is written into one selected word line. Plural word lines in one block are sequentially selected in an order from a word line WL0, and data is written into memory cells connected to each of the selected word lines.

Figure 10A:
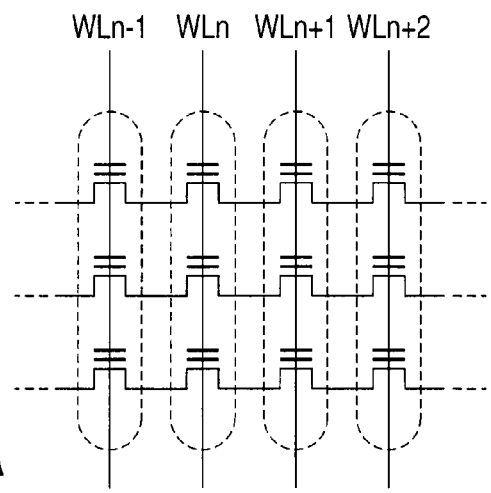
FIG. 10A is a circuit diagram representing a part of a cell array.
Figure 10B:
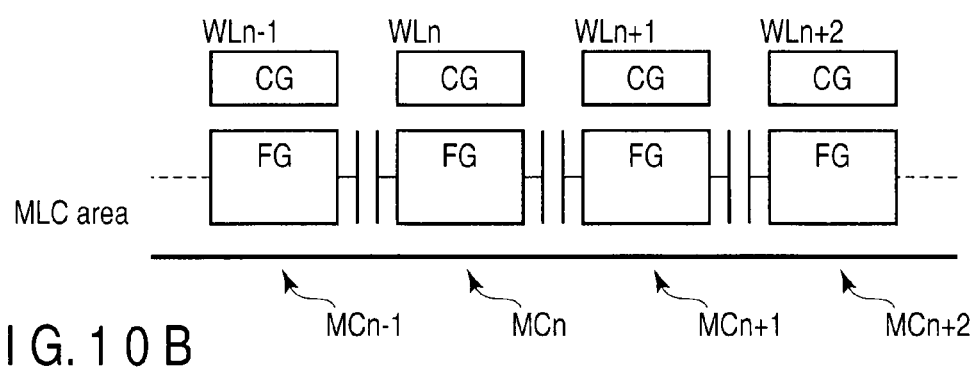
FIG. 10B is a configuration diagram representing a part of the cell array.

Attention will now be paid to memory cells MCn connected to a word line WLn as represented in FIG. 10A and FIG. 10B.

Figure 11:
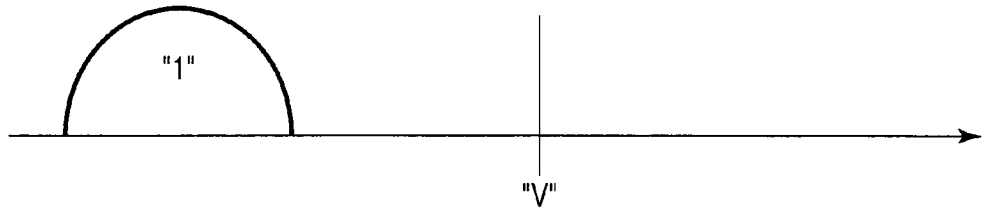
FIG. 11 is a graph representing transition of a threshold voltage of memory cells.
Figure 12:
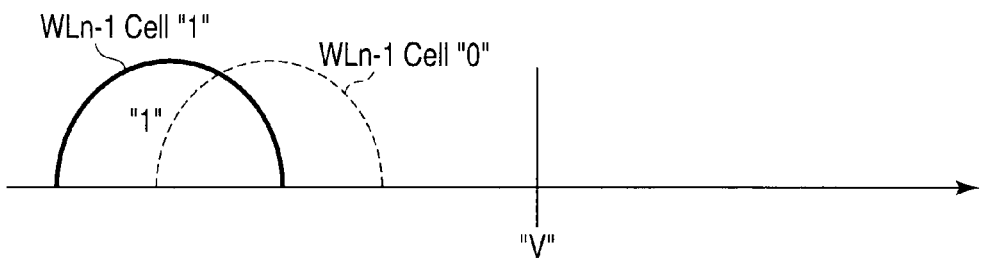
FIG. 12 is a graph representing transition of a threshold voltage of memory cells in accordance with writing of adjacent cells.
Figure 13:
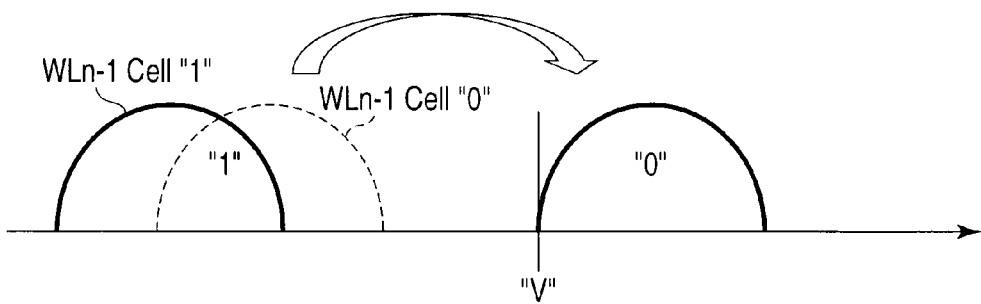
FIG. 13 is a graph representing transition of a threshold voltage of memory cells.

FIG. 11, FIG. 12, and FIG. 13 represent transition of a threshold voltage of the memory cells MCn. FIG. 11 represents a threshold voltage before data is written into memory cells MCn−1 connected to a word line WLn−1 which is selected prior to the word line WLn.

FIG. 12 represents a threshold voltage of cells MCn after data is written into memory cells MCn−1. As represented in FIG. 12, if data in cells MCn−1 is "1" (non-write), a threshold voltage of the cells MCn−1 is the same as that of FIG. 11. Otherwise, if data in the cells MCn−1 is "0" (write), the threshold voltage of the cells MCn−1 increases as indicated by a broken line due to coupling capacity between the cells.

Next, when the cells MCn are written up to a verify level, the threshold voltage of the cells MCn becomes as represented in FIG. 13.

Figure 14:
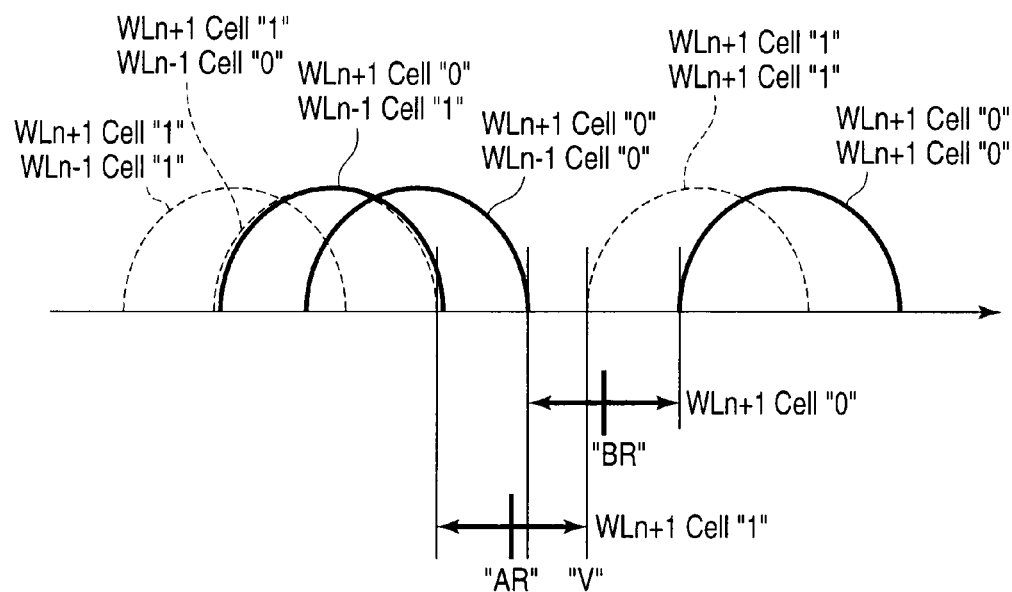
FIG. 14 is a graph representing conventional read levels.
Figure 15:
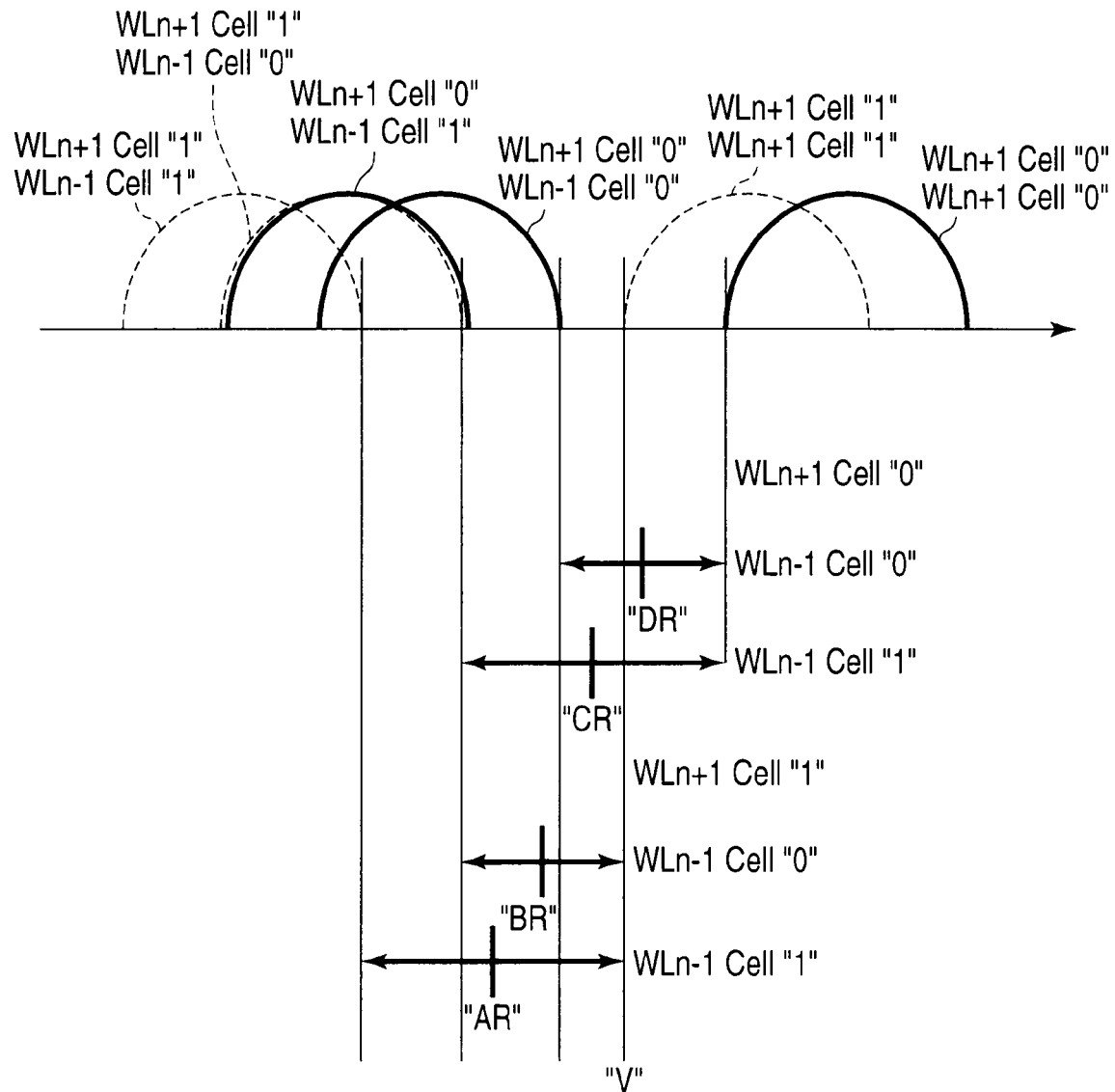
FIG. 15 is a graph representing read levels according to the first embodiment.

Thereafter, when data is written into cells MCn+1 connected to a word line WLn+1, the threshold distribution of the cells MCn becomes as represented in FIG. 14 and FIG. 15, in accordance with data in the cells MCn+1 and MCn−1.

(Read)

A threshold voltage of cells MCn is as represented in FIG. 14 and FIG. 15, due to capacitive coupling between floating gates of the cells MCn connected to the word line WLn and those of the cells MCn−1 and MCn+1 connected respectively to adjacent word lines WLn−1 and WLn+1. Therefore, for example, as represented in FIG. 14, a threshold voltage of memory cells connected to WLn+1 is read when data is read from the memory cells connected to the word line WLn. If data in the memory cells connected to the word line WLn+1 is "1", the read level is set to "AR". Otherwise, if data in the memory cells connected to the word line WLn+1 is "0", the read level can be read as "BR".

However, as represented in FIG. 3, when simultaneously reading data from plural memory cells connected to one word line, the read operation is performed by using both the read levels "AR" and "BR". Thereafter, in accordance with data of the word line WLn+1, correct read data between data read by using the read level "AR" and data read by using the read level "BR" is taken as read data from the word line WLn.

However, as represented in FIG. 14 and FIG. 15, threshold levels of data "1" differ depending on data of word lines WLn+1 and WLn−1 in the memory cells connected to the word line WLn. Therefore, the read operation in FIG. 14 is not satisfactory.

Hence, according to the first embodiment, data in memory cells connected to WLn+1 and data in memory cells connected to WLn−1 are read when reading data from the word line WLn, as represented in FIG. 15. Based on the read data, a read level for the memory cells connected to WLn is determined. Specifically, reading is performed based on the following conditions.

If WLn+1 is "1" and if WLn−1 is "1", the read level for WLn is set to "AR".

If WLn+1 is "1" and if WLn−1 is "0", the read level for WLn is set to "BR".

If WLn+1 is "0" and if WLn−1 is "1", the read level for WLn is set to "CR".

If WLn+1 is "0" and if WLn−1 is "0", the read level for WLn is set to "DR".

However, as represented in FIG. 3, data is read simultaneously from plural memory cells connected to one word line, i.e., "AR", "BR", "CR", and "DR" are read. In accordance with data of WLn+1 and WLn−1, a correct data read result is taken as read data from WLn.

If the levels "BR" and "CR" are close to each other, only one of "BR" and "CR" may be read.

Otherwise, if arbitrary ones of the levels "AR", "BR", "CR", and "DR" are close to each other, reading may be limited to reading of one of the close levels.

Figure 16:
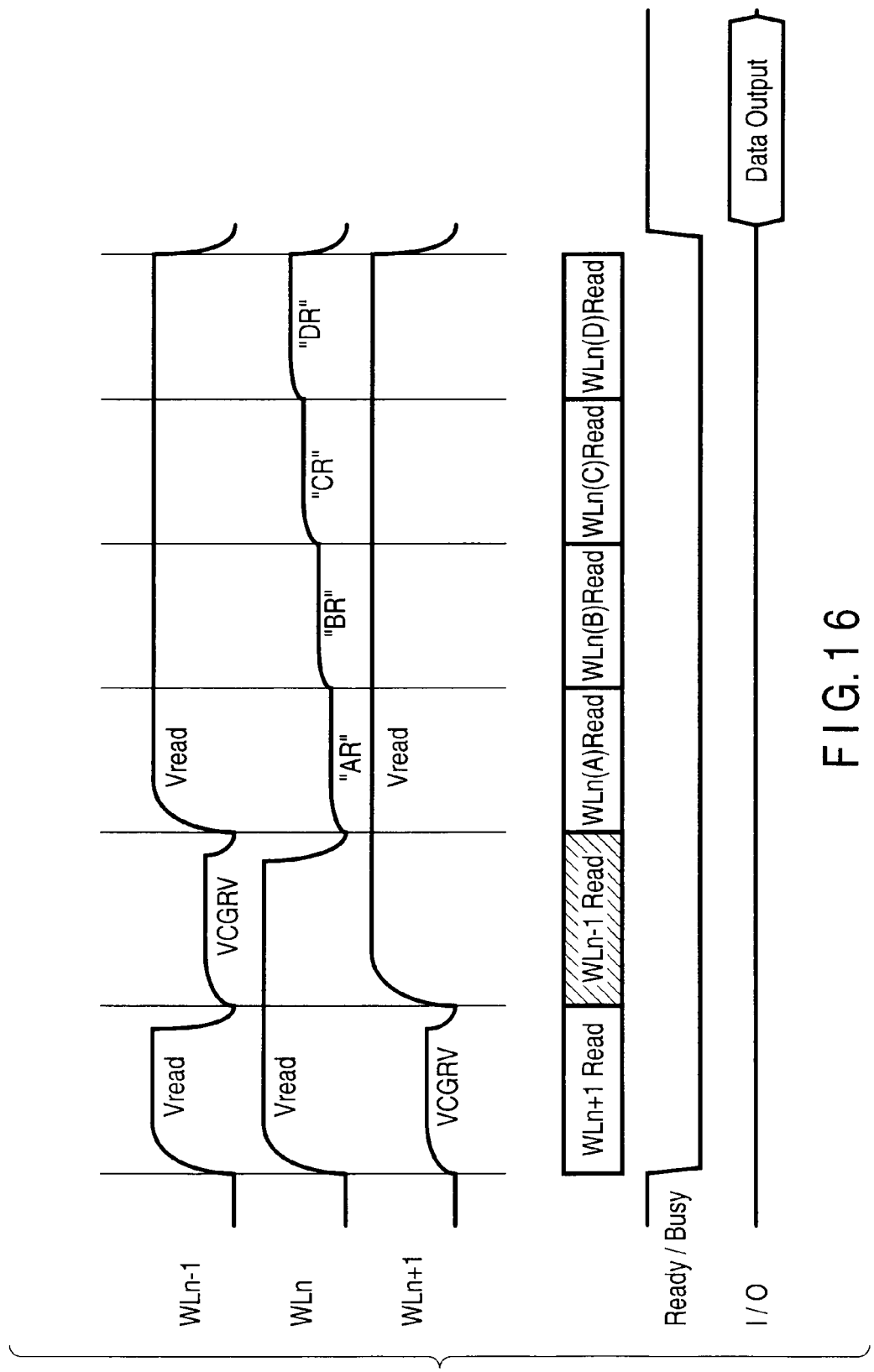
FIG. 16 is a waveform chart representing a read operation according to the first embodiment.

FIG. 16 represents waveforms in a reading operation corresponding to FIG. 15. At first, a read level VCGRV is applied to the word line WLn+1, a voltage Vread which turns on cells without fail is applied to the word lines WLn and WLn−1, and data from cells connected to the word line WLn+1 is read.

Next, a read level VCGRV is applied to the word line WLn−1, and a voltage Vread which turns on cells without fail is applied to the word lines WLn and WLn+1. Data is thereby read from the memory cells connected to the word line WLn−1.

Thereafter, a voltage Vread which turns on cells without fail is applied to the word lines WLn+1 and WLn−1. The word line WLn is applied with the read levels "AR", "BR", "CR", and "DR" in this order, and data is thereby read from the word line WLn. Thereafter, in accordance with data read from memory cells connected to the word lines WLn+1 and WLn−1, read data from the word line WLn is selected from results of reading the read levels "AR", "BR", "CR", and "DR". If a threshold voltage of memory cells in the word line WLn is higher than the read level, data becomes "0". Otherwise, if the threshold voltage of memory cells in the word line WLn is lower than the read level, data becomes "1".

Figure 17:
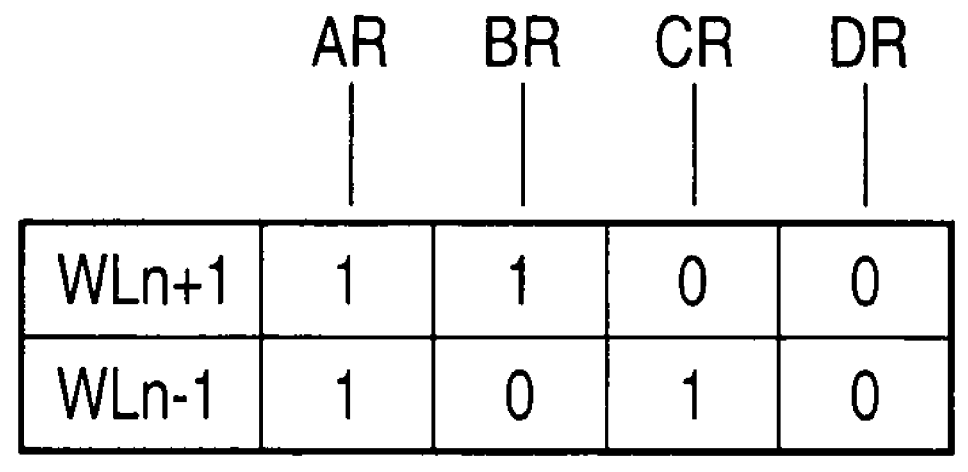

FIG. 17 represents a relationship between data read from memory cells connected to the word lines WLn+1 and WLn−1 and read results concerning the read levels "AR", "BR", "CR", and "DR". Thus, in accordance with data read from memory cells connected to the word lines WLn+1 and WLn−1, one of data read by using the read levels "AR", "BR", "CR", and "DR" is output as read data from the word line WLn.

According to the first embodiment described above, data is read from memory cells connected to the word line WLn−1 which is subjected to the write operation prior to the word line WLn and from memory cells connected to the word line WLn+1 which is subjected to the write operation next to the word line WLn. Based on the read data, one of data read from the word line WLn by using read levels "AR", "BR", "CR", and "DR" is output as read data. Therefore, even if a threshold voltage of erase cells connected to the word line WLn is increased due to write data in memory cells connected to adjacent word lines WLn−1 and WLn+1, data can be accurately read from memory cells connected to the word line WLn.

Second Embodiment

FIG. 18 represents the second embodiment in FIG. 16. In an operation represented in FIG. 16, read levels "AR", "BR", "CR", and "DR" are applied to the word line WLn when reading a word line WLn.

In contrast, in the second embodiment represented in FIG. 18, when reading a potential of the word line WLn, the potential of the word line WLn is made constant, and a voltage of an adjacent word line WLn−1 and/or a voltage of an adjacent word line WLn+1 is set to a higher potential than Vread and Vread.

If data "0" is written into adjacent cells, a threshold level of cells connected to the word line WLn is increased by capacitive coupling between floating gates. This is because electrons have been injected into floating gates of adjacent cells. Therefore, if data "0" is written into adjacent cells, a voltage Vread supplied to the word lines of the adjacent cells is set to a higher voltage Vread+α, and reading is performed, so as to cancel electric charges of electrons injected into the adjacent cells. Here, α may be a voltage which can cancel an increase of a threshold level caused by capacitive coupling due to electrons injected into the adjacent cells.

Alternatively, if Vread+α is a high voltage and causes a problem of a read disturb, Vread of adjacent word lines may be reduced at the time of verify reading during writing, and Vread of adjacent word lines is set to a higher value than the voltage at the time of the verify reading. In particular, during writing into the word line WLn, the threshold voltage of cells in the word line WLn+1 is low, and therefore, Vread can be reduced. In this case, for example, Vread1 and Vread2 are as represented in FIG. 19 where Vread1 and Vread2 are respectively Vread for the word lines WLn−1 and WLn+1 during verification. Vread1 and Vread2 each satisfy, for example, Vread1<=Vread and Vread2<=Vread.

At first, as represented in FIG. 18 and FIG. 19, the word line WLn+1 is applied with read levels VCGRV, and the word lines WLn and WLn−1 are applied with a voltage Vread which turns cells on without fail, and data is read from memory cells connected to the word line WLn+1.

Next, a read level VCGRV is applied to the word line WLn−1, and a voltage Vread which turns cells on without fail is applied to the word lines WLn and WLn+1. Data is thereby read from the memory cells connected to the word line WLn−1.

Thereafter, a read level VCGRV (substantially equal to "AR") is applied to the word line WLn, and a voltage Vread is applied to the word lines WLn+1 and WLn−1. This potential relationship corresponds to when the read level is set to "AR" where the word line WLn+1 is "1" and the word line WLn−1 is "1" in the first embodiment.

Next, the word line WLn+1 is left at the voltage Vread, and the voltage of the word line WLn−1 is set to the voltage Vread+α. This potential relationship corresponds to when the read level is set to "BR" where the word line WLn+1 is "1" and the word line WLn−1 is "0".

Further, the voltage of the word line WLn+1 is increased to Vread+α, and the voltage of the word line WLn−1 is maintained at Vread+α. This potential relationship corresponds to when the read level is set to "DR" where the word line WLn+1 is "0" and the word line WLn−1 is "0".

Next, the voltage of the word line WLn+1 is maintained at Vread+α, and the voltage of the word line WLn−1 is set to Vread. This potential relationship corresponds to when the read level is set to "CR" where the word line WLn+1 is "0" and the word line WLn−1 is "1".

From data read on the potential relationships as described above, one item of data is selected and taken as data from the word line WLn, based on data concerning the word lines WLn−1 and WLn+1.

In the example in FIG. 19, if voltages Vread2 and Vread1 are respectively applied to the word lines WLn+1 and WLn−1 and the voltage Vread is set to Vread+α when reading from memory cells connected to the word line WLn, voltages increased from Vread2 and Vread1 are applied.

In the second embodiment, an order of potentials supplied to the word lines WLn−1 and WLn+1 may be modified, and a read order may be changed.

If the levels "BR" and "CR" are close to each other, only one of "BR" and "CR" may be read. Alternatively, if arbitrary ones of the levels "AR", "BR", "CR", and "DR" are close to each other, reading may be limited to reading of one of the close levels.

According to the second embodiment as described above, with a constant read level VCGRV (substantially equal to "AR") applied to the word line WLn, the read levels Vread and Vread+α are sequentially applied to the word lines WLn−1 and WLn+1. In this manner, any influence of the threshold voltages of memory cells connected to the word lines WLn−1 and WLn+1 is suppressed, and data can be accurately read from memory cells connected to the word line WLn.

In addition, there is no need of generating plural read levels "AR", "BR", "CR", and "DR". Therefore, a simplified circuit configuration can be achieved. Further, read operations using the plural read levels "AR", "BR", "CR", and "DR" are not required. Therefore, high-speed read operations can be achieved in some cases.

Third Embodiment

FIG. 20A, FIG. 20B, FIG. 20C, FIG. 20D, FIG. 20E, FIG. 20F, FIG. 20G, FIG. 21A, FIG. 21B, FIG. 21C, FIG. 21D, FIG. 22, FIG. 23, FIG. 24, and FIG. 25 represent the third embodiment.

Figure 23:
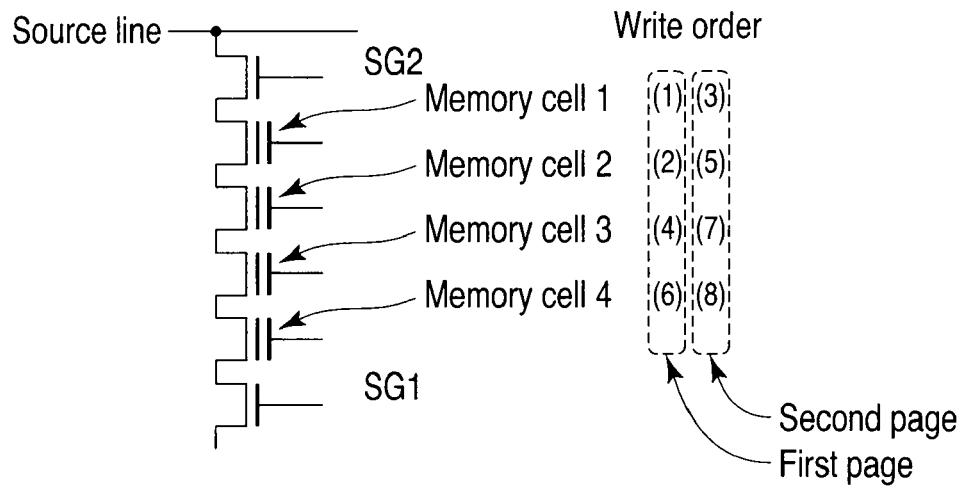
FIG. 23 is a diagram schematically representing an order of writing with respect to FIGS. 20A to 20G.
Figure 24:
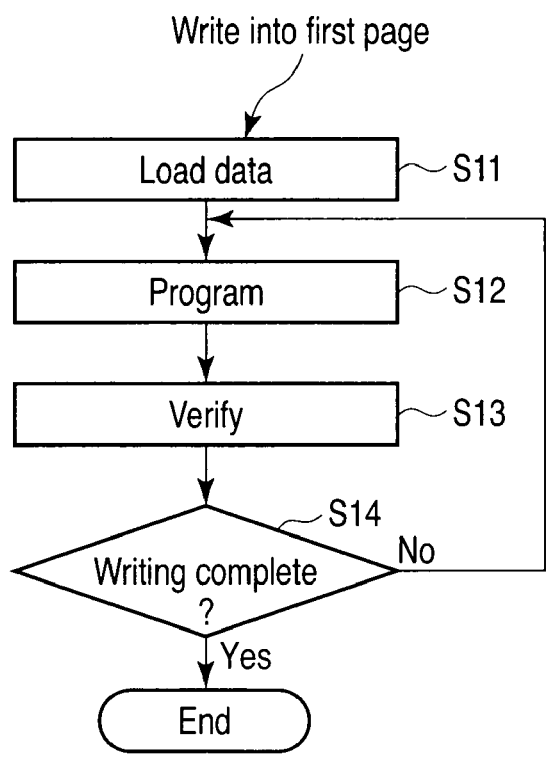
FIG. 24 is a flowchart schematically representing a write operation for the first page.
Figure 25:
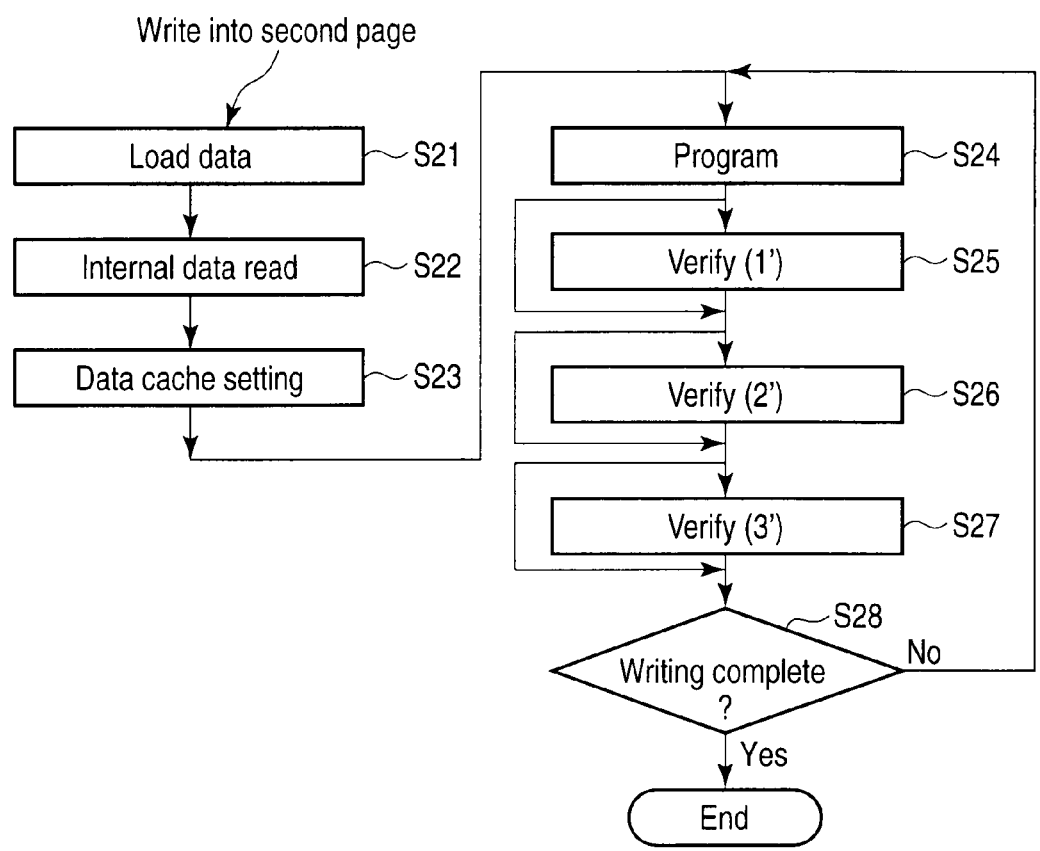
FIG. 25 is a flowchart schematically representing a write operation for the second page.

FIG. 20A, FIG. 20B, FIG. 20C, FIG. 20D, FIG. 20E, FIG. 20F, and FIG. 20G represent a state in which 4-level data is written into a NAND flash memory. FIG. 23 schematically represents an order of writing in FIG. 20A, FIG. 20B, FIG. 20C, FIG. 20D, FIG. 20E, FIG. 20F, and FIG. 20G. FIG. 24 schematically represents a write operation for a first page. FIG. 25 schematically represents a write operation for a second page. An order of writing into memory cells is as represented in FIG. 23. Hereinafter, a write operation of writing 4-level data will be described with reference to FIG. 23, FIG. 24, and FIG. 25.

At first, one bit of 2-bit data is written into one memory cell, based on a write sequence for the first page (lower page) as represented in FIG. 24 (FIG. 20B). That is, data for the first page is loaded from outside into a data latch circuit in the data storage circuit 10 (S11). Thereafter, a write operation and a verify operation for the first page are performed, based on data in the data latch circuit (S12, S13). An operation as described above is repeated until data for one page is all written (S14-S11).

Thereafter, writing into adjacent cells is performed in the same write sequence as represented in FIG. 23. By writing into adjacent cells, threshold voltages of memory cells which have been written early shift under the influence of coupling between cells (FIG. 20C).

Next, the remaining one bit of 2-bit data is written, based on a write sequence for the second page (upper page) represented in FIG. 25. That is, data for the second page is loaded into the data latch circuit (S21). Thereafter, data for the first page which has been written first is read by internal data reading (S22). This read operation is to read 2-level data. Therefore, the read operation described in the publication No. 2004-326866 or the read operation described in the first or second embodiment is applicable. In particular, it is desirable when data read by the internal data reading is not corrected by ECC but is taken as write data for the second page because highly accurate reading is required. By the read operation as described above, read accuracy can be improved. Based on the read data and data loaded into the data latch circuit, data for the data latch circuit is operated, and write data for the second page is set (S23). Based on this set data, a write operation for the second page is performed (S24). Thereafter, a verify operation is performed by using three verify levels corresponding to write data (S25 to S27). This verify level is set to levels which are slightly lower than an original verify level. The operation as described above is repeated until all data is written (S28 to S24). In this manner, 4-level data is roughly written (FIG. 20D).

Next, data for the second page is written into adjacent cells in the same manner as described above. Accordingly, a threshold voltage, which has been written before, shifts under the influence of coupling between cells (FIG. 20E).

Thereafter, 2-bit data to be stored into one memory cell is written again by using an original verify level (FIG. 20F). Although the 2-bit data to be written may be supplied externally, 2-bit write data may be recovered from a roughly written 4-level threshold distribution as represented in FIGS. 20D and 20E. For a read operation when recovering the 2-bit write data, the read operation described in the foregoing publication No. 2004-326866 or the read operation described in the first or second embodiments can be used.

Subsequently, as writing into adjacent cells is performed in the same manner as described above, a slight shift takes place (FIG. 20G).

As described above, in memory cells in which data "1", "2", and "3" as represented in FIGS. 20A, 20B, 20C, 20D, 20E, 20F, and 20G are written, threshold voltages corresponding to the data "1", "2", and "3" suppress influence of coupling between cells, and therefore, sufficient margins are ensured. However, a threshold voltage of an erased cell, namely a cell into which data "0" is written, increases in accordance with writing into adjacent cells.

FIG. 21A, FIG. 21B, FIG. 21C, and FIG. 21D specifically represent a state in which a threshold voltage of an erase cell increases in accordance with writing into adjacent cells. That is, as data "0", "1", "2", and "3" are written, a threshold voltage of erased cells connected to the word line WLn increases. Further, as data "0", "1", "2", and "3" are written into cells connected to the word line WLn+1, a threshold voltage of erased cells connected to the word line WLn increases. FIG. 21A, FIG. 21B, FIG. 21C, and FIG. 21D respectively represent states in which a threshold voltage of erase cells connected to the word line WLn increases when data "0", "1", "2", and "3" are written to the cells connected to the word line WLn+1, respectively. Thus, threshold voltages are found to increase depending on data of cells connected to the word line WLn−1 which is selected before the word line WLn and on data of cells connected to the word line WLn+1 after the word line WLn.

FIG. 22 represents how threshold voltages of erase cells connected to the word line WLn change, in an example in which data "0", "1", "2", and "3" are written into cells connected to the word lines WLn−1 and WLn+1. For example, if data "0" is written into each of cells connected to the word lines WLn−1 and WLn+1, a threshold voltage of erase cells connected to the word line WLn does not change. That is, an increase in threshold voltage is 0V. Otherwise, if data "3" is written into each of cells connected to the word lines WLn−1 and WLn+1, a threshold voltage of erasure cells connected to the word line WLn increases to 0.7V. Thus, a threshold voltage of erase cells connected to the word line WLn is changed by data written in cells connected to the word lines WLn−1 and WLn+1.

Hence, in the third embodiment, read levels are set in accordance with a variability range of the threshold voltage of erase cells. That is, a threshold voltage of erase cells connected to the word line WLn is 0V as denoted by an arrow of a broken line in FIG. 22, and the read level is set to "AR". If change of a threshold voltage is within a range of 0.15V to 0.3V, the read level is set to "BR". Alternatively, if change of the threshold voltage is within a range of 0.35V to 0.5V, the read level is set to "CR". Still alternatively, if change of the threshold voltage is 0.6V or more, the read level is set to "DR".

For example, if data "0" is written into cells connected to the word line WLn−1 and if data "2" is written into cells connected to the word line WLn+1, the read level is set to "BR". If data "3" is written into the word line WLn−1 and if data "1" is written into cells connected to the word line WLn+1, the read level is set to "CR".

According to the third embodiment described above, read levels of erased cells are changed on the basis of data written into adjacent cells selected by the word lines WLn−1 and WLn+1. Therefore, even if a threshold voltage of erased cells is increased by writing into adjacent cells, data can be steadily read.

In the present embodiment, a read potential for the word line WLn is changed when reading the word line WLn. However, levels of Vread for adjacent word lines WLn+1 and WLn−1 may be changed without changing the read potential for the word line WLn, as in the second embodiment.

Further, as represented in FIG. 3, data is read simultaneously from plural cells connected to one word line. Therefore, "AR", "BR", "CR", and "DR" are read, and a result of accurately reading data may be taken as read data from the word line WLn, in accordance with data from the word lines WLn+1 and WLn−1.

Each of the embodiments described above has been described where 2-level or 4-level data is read. However, the embodiments are not limited to 2-level data and 4-level data but are applicable where 3-value, 8-level, or 16-level data is read.

In each of the embodiments, when reading data from the memory cell connected to the word line WLn, read conditions for the memory cell are changed in accordance with the word line WLn+1 which is adjacent to the word line WLn. The data is selected by using appropriate read conditions from two or more data read from the memory cell by using two or more read conditions. However, it is not limited to this. When reading data from the memory cell, it may be connected to the same word line as the memory cell, and may read using the data of the memory cell and an adjoining memory cell, and the data of the memory cell which exists in a slanting position to the memory cell, and conditions may be changed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array comprising first, second, and third memory cells each of which stores k-bit data (where k is a natural number not smaller than 1), the first and second memory cells being adjacent to each other, the second and third memory cells being adjacent to each other, and the data being stored into the first, second, and third memory cells in this order; and
   a controller which reads data from the third and first memory cells when reading data from the second memory cell, and changes a read condition for the second memory cell in accordance with the data read from the third and first memory cells.

2. The device according to claim 1, wherein
the read condition comprises a plurality of different read voltages for reading the data from the second memory cell.

3. The device according to claim 1, wherein
the read condition comprises a plurality of different voltages applied to the first and third memory cells.

4. The device according to claim 3, wherein
the plurality of voltages comprise a first voltage for turning on a non-selected memory cell, and a second voltage which is higher than the first voltage by a voltage which cancels increase of a threshold voltage based on write data in adjacent cells.

5. The device according to claim 3, wherein
the plurality of voltages comprise a first voltage for turning on a non-selected memory cell during write-verify reading, and a second voltage which is higher than the first voltage by a voltage which cancels increase of a threshold voltage based on write data in adjacent cells.

6. The device according to claim 1, wherein
the read condition comprises a read voltage for reading the second memory cell in an erased state which is set, based on read data from the first and third memory cells.

7. A semiconductor memory device comprising
a memory cell array comprising first, second, and third memory cells each of which stores k-bit data (where k is a natural number not smaller than 1), the first and second memory cells being adjacent to each other, the second and third memory cells being adjacent to each other, and the data being stored into the first, second, and third memory cells in this order; and
a controller which reads data from the third and first memory cells when reading data from the second memory cell, reads the data from the second memory cell with a plurality of read conditions changed a plurality of times, and takes selected one data as read data from the second memory cell with a plurality of read conditions in accordance with the data read from the third and first memory cells.

8. The device according to claim 7, wherein
the plurality of read conditions are a plurality of different read voltages for reading the data from the second memory cell.

9. The device according to claim 7, wherein
the plurality of read conditions are a plurality of different voltages applied to the first and third memory cells.

10. The device according to claim 9, wherein
the plurality of voltages comprise a first voltage for turning on a non-selected memory cell, and a second voltage which is higher than the first voltage by a voltage which cancels increase of a threshold voltage based on write data in adjacent cells.

11. The device according to claim 9, wherein
the plurality of voltages comprise a first voltage for turning on a non-selected memory cell during write-verify reading, and a second voltage which is higher than the first voltage by a voltage which cancels increase of a threshold voltage based on write data in adjacent cells.

12. The device according to claim 7, wherein
the plurality of read conditions comprise a read voltage for reading the second memory cell in an erased state which is set, based on read data from the first and third memory cells.

13. The device according to claim 1, wherein
the second cell is an erased state when the first cell is written, and a threshold voltage of the second cell is shifted in accordance with the data stored in the first cell.

14. The device according to claim 7, wherein
the second cell is an erased state when the first cell is written, and a threshold voltage of the second cell is shifted in accordance with the data stored in the first cell.

* * * * *